United States Patent
Cho et al.

(10) Patent No.: US 12,219,822 B2
(45) Date of Patent: *Feb. 4, 2025

(54) ORGANIC LIGHT EMITTING DIODE DISPLAY DEVICE

(71) Applicant: SAMSUNG DISPLAY CO., LTD., Yongin-si (KR)

(72) Inventors: Junghyun Cho, Yongin-si (KR); Haeyoung Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 941 days.

This patent is subject to a terminal disclaimer.

(21) Appl. No.: 17/141,061

(22) Filed: Jan. 4, 2021

(65) Prior Publication Data

US 2021/0126068 A1  Apr. 29, 2021

Related U.S. Application Data

(62) Division of application No. 15/868,060, filed on Jan. 11, 2018, now Pat. No. 10,916,607.

(30) Foreign Application Priority Data

Jan. 12, 2017 (KR) .......................... 10-2017-0005380

(51) Int. Cl.
*H10K 59/124* (2023.01)
*H10K 50/852* (2023.01)
(Continued)

(52) U.S. Cl.
CPC ......... *H10K 59/124* (2023.02); *H10K 50/852* (2023.02); *H10K 50/854* (2023.02);
(Continued)

(58) Field of Classification Search
CPC ............. H10K 59/1201; H10K 59/122; H10K 59/124; H10K 59/352; H10K 59/353; H10K 59/876; H10K 50/852; H10K 50/854
See application file for complete search history.

(56) References Cited

U.S. PATENT DOCUMENTS 8,933,459 B2 * 1/2015 Yoon .................. H10K 59/1213
438/149
9,184,387 B2 * 11/2015 Kim .................... H10K 59/122
(Continued)

FOREIGN PATENT DOCUMENTS

CN    102823018 A  * 12/2012 ......... H01L 51/5268
JP    2008-235605 A    10/2008
(Continued)

OTHER PUBLICATIONS

Provisional double patenting rejection over claims of the above-identified application; USPTO Office action mailed Jan. 2, 2019 in U.S. Appl. No. 15/828,630.
(Continued)

*Primary Examiner* — Kyoung Lee
(74) *Attorney, Agent, or Firm* — Lewis Roca Rothgerber Christie LLP

(57) ABSTRACT

An organic light emitting diode display device includes a substrate, a protection layer on the substrate, the protection layer including a trench pattern and a recessed portion, a first electrode on the protection layer, a pixel defining layer on the protection layer, the pixel defining layer defining an opening that exposes at least a part of the first electrode, an organic light emitting layer on the first electrode, and a second electrode on the organic light emitting layer. The recessed portion overlaps the opening and is spaced apart from an edge of the opening in a plan view. The trench pattern includes a plurality of trenches extending along a
(Continued)

first direction. Each trench of the plurality of trenches is spaced apart from the first electrode in a plan view and has a concave cross-section.

11 Claims, 19 Drawing Sheets

(51) Int. Cl.
| | |
|---|---|
| H10K 50/854 | (2023.01) |
| H10K 59/122 | (2023.01) |
| H10K 59/35 | (2023.01) |
| H10K 59/12 | (2023.01) |

(52) U.S. Cl.
CPC ......... H10K 59/122 (2023.02); H10K 59/352 (2023.02); H10K 59/353 (2023.02); *H10K 59/1201* (2023.02)

(56) References Cited

U.S. PATENT DOCUMENTS

| | | | |
|---|---|---|---|
| 9,287,526 | B2 | 3/2016 | Miyazawa et al. |
| 9,401,389 | B2* | 7/2016 | Cho ................. H10K 50/86 |
| 9,577,208 | B2 | 2/2017 | Lee et al. |
| 10,916,607 | B2* | 2/2021 | Cho ................. H10K 59/124 |
| 2005/0046342 | A1 | 3/2005 | Park et al. |
| 2006/0033429 | A1 | 2/2006 | Fujimura et al. |
| 2006/0091399 | A1 | 5/2006 | Lee |
| 2006/0220016 | A1 | 10/2006 | Lee et al. |
| 2008/0024402 | A1 | 1/2008 | Nishikawa et al. |
| 2009/0026445 | A1 | 1/2009 | Noh et al. |
| 2010/0060148 | A1 | 3/2010 | Hwang et al. |
| 2010/0320453 | A1 | 12/2010 | Tanaka et al. |
| 2012/0313844 | A1 | 12/2012 | Im et al. |
| 2013/0075734 | A1 | 3/2013 | Cain et al. |
| 2014/0042402 | A1* | 2/2014 | Prushinskiy ........ H10K 71/18 438/23 |
| 2014/0061593 | A1 | 3/2014 | Liu et al. |
| 2014/0151651 | A1 | 6/2014 | Jin et al. |
| 2015/0022495 | A1 | 1/2015 | Bussat et al. |
| 2015/0064915 | A1 | 3/2015 | Wuister |
| 2015/0069339 | A1* | 3/2015 | Han ................. H10K 50/8426 257/40 |
| 2015/0188088 | A1 | 7/2015 | Kubota et al. |
| 2016/0087210 | A1 | 3/2016 | Stromer et al. |
| 2016/0104756 | A1 | 4/2016 | Lee et al. |
| 2016/0209711 | A1* | 7/2016 | Ge ..................... G02F 1/1368 |
| 2017/0005286 | A1* | 1/2017 | Yun ................. H10K 59/80521 |
| 2017/0125738 | A1 | 5/2017 | Kim et al. |
| 2018/0061907 | A1 | 3/2018 | Kim et al. |
| 2018/0069194 | A1 | 3/2018 | Ono et al. |
| 2018/0120623 | A1 | 5/2018 | Shina |
| 2018/0151643 | A1 | 5/2018 | Lee et al. |
| 2018/0158887 | A1 | 6/2018 | Yun et al. |
| 2018/0190740 | A1 | 7/2018 | Bang et al. |
| 2018/0212198 | A1 | 7/2018 | Inoue et al. |
| 2019/0006626 | A1 | 1/2019 | Kim et al. |

FOREIGN PATENT DOCUMENTS

| | | | |
|---|---|---|---|
| KR | 10-2006-0027337 | 3/2006 | |
| KR | 10-2011-0087433 A | 8/2011 | |
| KR | 10-2013-0095645 | 8/2013 | |
| KR | 10-2014-0072711 A | 6/2014 | |
| KR | 10-2014-0127690 | 11/2014 | |
| KR | 20160094581 A * | 1/2015 | ............ H10K 71/18 |
| KR | 10-2015-0039112 | 4/2015 | |
| KR | 10-2016-0042322 A | 4/2015 | |
| KR | 10-2016-066112 A | 6/2016 | |
| KR | 20160064373 A * | 6/2016 | ............ H01L 27/32 |
| KR | 10-2016-0080834 | 7/2016 | |
| KR | 10-2017-0005272 A | 1/2017 | |
| KR | 10-2017-0052467 | 5/2017 | |
| TW | 1297210 B | 5/2008 | |

OTHER PUBLICATIONS

Provisional double patenting rejection over claims of the above-identified application; USPTO Office action mailed Mar. 4, 2019 in U.S. Appl. No. 15/827,377.

Office Action issued by the Korean Patent Office for Patent Application No. 10-2017-0005380, issued May 6, 2024, 11 pages, together with English translation of same (14 pages), total 25 pages.

* cited by examiner

ORGANIC LIGHT EMITTING DIODE DISPLAY DEVICE

CROSS-REFERENCE TO RELATED APPLICATIONS

This application is a divisional of U.S. patent application Ser. No. 15/868,060, filed Jan. 11, 2018, which claims priority to and the benefit of Korean Patent Application No. 10-2017-0005380, filed Jan. 12, 2017, the entire content of both of which is incorporated herein by reference.

BACKGROUND

1. Field

Embodiments relate to an organic light emitting diode ("OLED") display device.

2. Discussion of the Related Art

Organic light emitting diode ("OLED") display devices are self-light emitting display devices that display images using an OLED emitting light. The OLED display devices are currently garnering attention by virtue of characteristics such as low power consumption, high luminance, high reaction speed, and the like.

SUMMARY

Embodiments are directed to an organic light emitting diode display device including a substrate, a protection layer on the substrate, the protection layer including a trench pattern and a recessed portion, a first electrode on the protection layer, a pixel defining layer on the protection layer, the pixel defining layer defining an opening that exposes at least a part of the first electrode, an organic light emitting layer on the first electrode, and a second electrode on the organic light emitting layer. The recessed portion overlaps the opening and is spaced apart from an edge of the opening in a plan view. The trench pattern includes a plurality of trenches extending along a first direction. Each trench of the plurality of trenches is spaced apart from the first electrode in a plan view and has a concave cross-section.

The plurality of trenches may be substantially parallel to each other.

The organic light emitting diode display device may further include a gate line and a data line on the substrate. The first direction is parallel to one of the gate line and the data line.

Each trench of the plurality of trenches may have a straight line shape in a plan view.

Each trench of the plurality of trenches may have a wavy shape in a plan view.

The plurality of trenches may further include a branch trench that branches off in a plan view and has a mesh shape in a plan view.

The organic light emitting diode display device may further include a gate line and a data line on the substrate. The first direction may have a predetermined angle with respect to one of the gate line and the data line.

The organic light emitting diode display device may include pixels of different colors. Openings in the pixel defining layer corresponding to respective ones of the pixels have different planar areas according to the color of the respective ones of the pixels.

The recessed portion may have a total planar area proportional to a planar area of the opening.

Embodiments are also directed to an organic light emitting diode display device, including a substrate, a protection layer on the substrate, the protection layer including a trench pattern and a recessed portion, a first electrode on the protection layer, a pixel defining layer on the protection layer, the pixel defining layer defining an opening, the opening exposing at least a part of the first electrode, an organic light emitting layer on the first electrode, and a second electrode on the organic light emitting layer. The recessed portion overlaps the opening and is spaced apart from an edge of the opening in a plan view. The trench pattern includes a plurality of trenches, each trench having a dot shape. Each trench of the plurality of trenches is spaced apart from the first electrode in a plan view and has a concave cross-section.

The plurality of trenches may have one of a circular shape or a polygonal shape.

The plurality of trenches may be spaced apart from each other by a predetermined distance.

The plurality of trenches may have a width in a range from about 1.0 μm to about 3.0 μm.

Embodiments are also directed to an organic light emitting diode display device including a substrate, a protection layer on the substrate, the protection layer including a trench pattern and a recessed portion, a first electrode on the protection layer, a pixel defining layer on the protection layer, the pixel defining layer defining an opening, the opening exposing at least a part of the first electrode, an organic light emitting layer on the first electrode, and a second electrode on the organic light emitting layer. The recessed portion overlaps the opening and is spaced apart from an edge of the opening o in a plan view. The trench pattern has a concave cross-section, is spaced apart from the first electrode in a plan view, and is formed unitarily to surround the first electrode on a plane.

The trench pattern may overlap the pixel defining layer.

A planar area of the trench pattern may be less than a planar area of the pixel defining layer.

A height of the trench pattern may be less than a height of the edge of the opening with respect to a surface of the substrate.

The trench pattern may be spaced apart from the first electrode by a distance of about 1 μm to about 5 μm.

The trench pattern may have a depth of about 0.2 μm to about 1.0 μm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
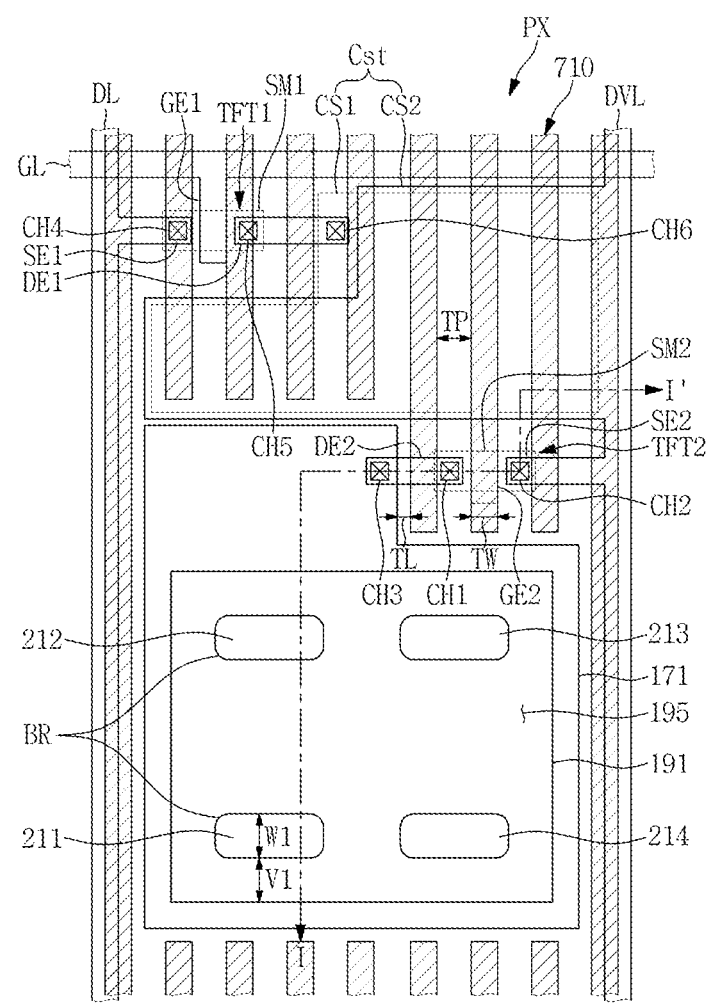
FIG. 1 illustrates a plan view of a pixel of an organic light emitting diode ("OLED") display device according to an embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe exemplary embodiments and like reference numerals refer to like elements throughout the specification.

Hereinafter, an embodiment will be described with reference to FIGS. 1 and 2.

FIG. 1 illustrates a plan view of a pixel of an organic light emitting diode ("OLED") display device according to an embodiment. FIG. 2 is a cross-sectional view taken along line I-I' of FIG. 1.

An OLED display device 101 according to embodiment illustrated in FIG. 1 includes a plurality of pixels PX. Herein, the term "pixel PX" may refer to a smallest unit for displaying images. Referring to FIGS. 1 and 2, the pixel PX may include a switching thin film transistor TFT1, a driving thin film transistor TFT2, an OLED 170 and a capacitor Cst.

The pixel PX may generate a light of a predetermined color, for example, one of red, green or blue. In some implementations, the color of the light generated in the pixel PX may be, for example, cyan, magenta, yellow, or the like.

The pixel PX may be connected to a gate line GL, a data line DL, and a driving voltage line DVL. The gate line GL may extend in one direction. The data line DL may extend in another direction that crosses the gate line GL. Referring to FIG. 1, the driving voltage line DVL may extend in a direction that is substantially the same as a direction in which the data line DL extends. The gate line GL may transmit a scan signal, the data line DL may transmit a data signal, and the driving voltage line DVL may transmit a driving voltage.

The thin film transistors TFT1 and TFT2 may include the driving thin film transistor TFT2 for controlling the OLED 170 and the switching thin film transistor TFT1 for switching the driving thin film transistor TFT2. For example, each pixel PX may include two thin film transistors TFT1 and TFT2. In various implementations, each pixel PX may include a different number of thin film transistors and/or capacitors, for example, one thin film transistor and one capacitor or three or more thin film transistors and two or more capacitors.

A portion in which the thin film transistors TFT1 and TFT2, the gate line GL, the data line DL, the driving voltage line DVL and the capacitor Cst are disposed may be referred to as a wiring portion. Each of the gate line GL, the data line DL, the driving voltage line DVL and the capacitor Cst may be referred to as a wiring. In addition, the thin film transistors TFT1 and TFT2 may be one of the wirings or a part of the wirings.

The switching thin film transistor TFT1 may include a first gate electrode GE1, a first source electrode SE1, a first drain electrode DE1, and a first semiconductor layer SM1. The first gate electrode GE1 may be connected to the gate line GL, and the first source electrode SE1 may be connected to the data line DL.

The first drain electrode DE1 may be connected to a first capacitor plate CS1 through a fifth contact hole CH5 and a sixth contact hole CH6. The switching thin film transistor TFT1 may transmit a data signal that is applied to the data line DL to the driving thin film transistor TFT2 according to a scan signal applied to the gate line GL.

The driving thin film transistor TFT2 may include a second gate electrode GE2, a second source electrode SE2, a second drain electrode DE2, and a second semiconductor layer SM2. The second gate electrode GE2 may be connected to the first capacitor plate CS1. The second source electrode SE2 may be connected to the driving voltage line DVL. The second drain electrode DE2 may be connected to a first electrode 171 through a third contact hole CH3.

An organic light emitting layer 172 may be disposed on the first electrode 171, and a second electrode 173 may be disposed on the organic light emitting layer 172. A common voltage may be applied to the second electrode 173, and the organic light emitting layer 172 may generate a light according to an output signal of the driving thin film transistor TFT2.

The capacitor Cst may be connected between the second gate electrode GE2 and the second source electrode SE2 of the driving thin film transistor TFT2. The capacitor Cst may charge and maintain a signal input to the second gate electrode GE2 of the driving thin film transistor TFT2. The capacitor Cst may include the first capacitor plate CS1 connected to the first drain electrode DE1 through the sixth contact hole CH6 and a second capacitor plate CS2 connected to the driving voltage line DVL.

The thin film transistors TFT1 and TFT2 and the OLED 170 may be disposed on a substrate 111.

The substrate 111 may include, for example, an insulating material such as glass, plastic, quartz, or the like. The material for the substrate 111 may be selected, for example, from materials that are excellent in mechanical strength, thermal stability, transparency, surface smoothness, ease of handling, water resistance, or the like.

A buffer layer may be disposed on the substrate 111. The buffer layer may substantially prevent diffusion of impurities into the switching thin film transistor TFT1 and the driving thin film transistor TFT2.

The first semiconductor layer SM1 and the second semiconductor layer SM2 may be disposed on the substrate 111. The first semiconductor layer SM1 and the second semiconductor layer SM2 may include a semiconductor material and may serve as active layers of the switching thin film transistor TFT1 and the driving thin film transistor TFT2, respectively. Each of the first semiconductor layer SM1 and the second semiconductor layer SM2 may include a source area SA, a drain area DA, and a channel area CA between the source area SA and the drain area DA.

The first semiconductor layer SM1 and the second semiconductor layer SM2 may include, for example, amorphous silicon or polycrystalline silicon, or may include, for example, an oxide semiconductor. For example, each of the first semiconductor layer SM1 and the second semiconductor layer SM2 may include an inorganic semiconductor material or an organic semiconductor material. The source area SA and the drain area DA may be doped with an n-type impurity or a p-type impurity.

A gate insulating layer 121 may be disposed on the first semiconductor layer SM1 and the second semiconductor layer SM2. The gate insulating layer 121 may protect the first semiconductor layer SM1 and the second semiconductor layer SM2. The gate insulating layer 121 may include an organic insulating material or an inorganic insulating material.

The first gate electrode GE1 and the second gate electrode GE2 may be disposed on the gate insulating layer 121. The first gate electrode GE1 and the second gate electrode GE2 may be disposed so as to overlap the channel areas CA of the first semiconductor layer SM1 and the second semiconductor layer SM2, respectively. In addition, the first capacitor plate CS1 may be disposed on the gate insulating layer 121. The second gate electrode GE2 and the first capacitor plate CS1 may have a unitary structure.

An insulating interlayer 122 may be disposed on the first gate electrode GE1, the second gate electrode GE2, and the first capacitor plate CS1. The insulating interlayer 122 may include an organic insulating material or an inorganic insulating material.

The first source electrode SE1, the first drain electrode DE1, the second source electrode SE2, and the second drain electrode DE2 may be disposed on the insulating interlayer 122. The second drain electrode DE2 may contact the drain area DA of the second semiconductor layer SM2 through a first contact hole CH1 defined at the gate insulating layer 121 and the insulating interlayer 122. The second source electrode SE2 may contact the source area SA of the second semiconductor layer SM2 through a second contact hole CH2 defined at the gate insulating layer 121 and the insulating interlayer 122. The first source electrode SE1 may contact the first semiconductor layer SM1 through a fourth contact hole CH4 defined at the gate insulating layer 121 and the insulating interlayer 122. The first drain electrode DE1 may contact the first semiconductor layer SM1 through the fifth contact hole CH5 defined at the gate insulating layer 121 and the insulating interlayer 122.

The data line DL, the driving voltage line DVL and the second capacitor plate CS2 may be disposed on the insulating interlayer 122. The second capacitor plate CS2 and the driving voltage line DVL may have a unitary structure.

A protection layer 130 may be disposed on the first source electrode SE1, the first drain electrode DE1, the second source electrode SE2 and the second drain electrode DE2. The protection layer 130 may protect the switching thin film transistor TFT1 and the driving thin film transistor TFT2 and also may planarize upper surfaces thereof.

Figure 3:
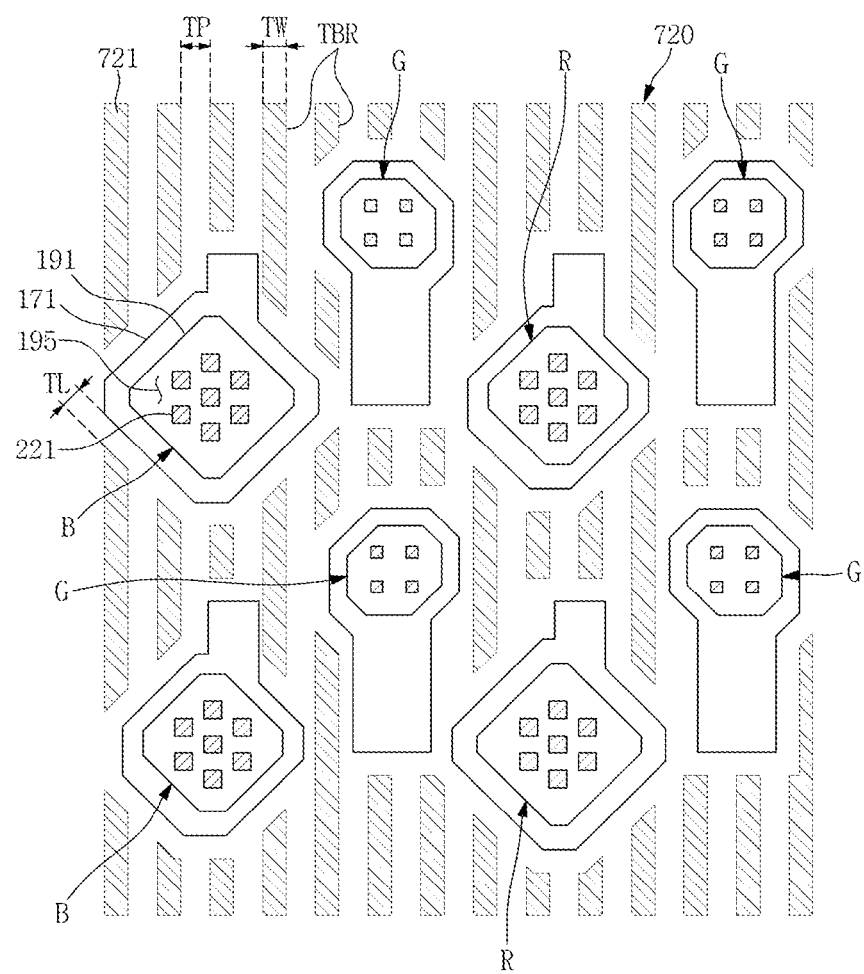
FIG. 3 illustrates a plan view of an arrangement of a first electrode, a recessed portion and a trench pattern of a pixel according to an embodiment.

According to an exemplary embodiment, the protection layer 130 may include a polymer resin. For example, the protection layer 130 may include polyimide (PI). Referring to FIGS. 1 and 3, the protection layer 130 may include recessed portions 211, 212, 213, and 214 and a trench pattern 710. The protection layer 130, the recessed portions 211, 212, 213, and 214, and the trench pattern 710 will be described below.

The first electrode 171 may be disposed on the protection layer 130. The first electrode 171 may be, for example, an anode. The first electrode 171 may be, for example, a pixel electrode.

The first electrode 171 may be connected to the second drain electrode DE2 of the driving thin film transistor TFT2 through the third contact hole CH3 defined at the protection layer 130.

A pixel defining layer 190 that divides a light emission area may be disposed on the protection layer 130.

The pixel defining layer 190 may include a polymer organic material. For example, the pixel defining layer 190 may include at least one of a polyimide (PI) resin, a polyacrylic resin, a PET resin, and a PEN resin. For example, the pixel defining layer 190 may include a polyimide (PI) resin.

The pixel defining layer 190 may define an opening 195, and the first electrode 171 may be exposed from the pixel defining layer 190 through the opening 195. In addition, a light emission area of the OLED 170, which may also be referred to as a "pixel area" may be defined by the opening 195.

Figure 2:
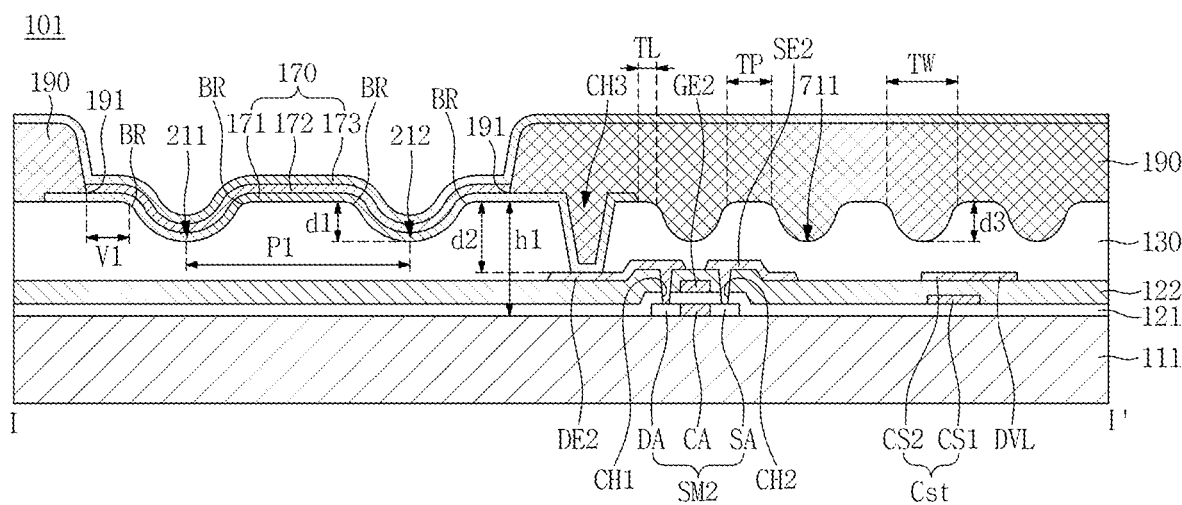
FIG. 2 illustrates a cross-sectional view taken along line I-I' of FIG. 1.

Referring to FIGS. 1 and 2, the pixel defining layer 190 may expose an upper surface of the first electrode 171. The pixel defining layer 190 may protrude from the first electrode 171 along a periphery of each of the pixels PX. The first electrode 171 may overlap at least a portion of the pixel defining layer 190 and does not overlap the pixel defining layer 190 at the opening 195. For example, the opening 195 may be defined as an area above the first electrode 171 that does not overlap the pixel defining layer 190. In addition, a boundary at which the pixel defining layer 190 contacts the first electrode 171 at the opening 195 may be referred to as an edge 191 of the opening 195.

The first electrode 171 may have conductivity, and may be a transmissive electrode, a transflective electrode, or a reflective electrode. When the first electrode 171 is a transmissive electrode, the first electrode 171 may include a transparent conductive oxide. For example, the transparent conductive oxide may include at least one of indium tin oxide (ITO), indium zinc oxide (IZO), zinc oxide (ZnO), and indium tin zinc oxide (ITZO). When the first electrode 171 is a transflective electrode or a reflective electrode, the first electrode 171 may include at least one of Ag, Mg, Al, Pt, Pd, Au, Ni, Nd, Ir, Cr, and Cu.

The organic light emitting layer 172 may be disposed on the first electrode 171. For example, the organic light emitting layer 172 may be disposed on the first electrode 171 at the opening 195. The organic light emitting layer 172 may be disposed on a sidewall of the opening 195 defined by the pixel defining layer 190 and on the pixel defining layer 190.

The organic light emitting layer 172 may include a light emitting material. In addition, the organic light emitting layer 172 may include a host and a light emitting dopant. The organic light emitting layer 172 may be manufactured in a general method, using a suitable material. For example, the organic light emitting layer 172 may be formed through various methods such as a vacuum deposition method, a spin coating method, a cast method, a Langmuir-Blodgett (LB) method, an inkjet printing method, a laser printing method, a laser induced thermal imaging (LITI) method, or the like.

At least one of a hole injection layer (HIL) and a hole transport layer (HTL) may be disposed between the first electrode 171 and the organic light emitting layer 172.

The second electrode 173 may be disposed on the organic light emitting layer 172.

The second electrode 173 may be a common electrode and may be a cathode.

The second electrode 173 may be a transmissive electrode, a transflective electrode, or a reflective electrode.

When the second electrode 173 is a transmissive electrode, the second electrode 173 may include at least one of Li, Ca, LiF/Ca, LiF/Al, Al, Mg, BaF, Ba, Ag, and Cu. For example, the second electrode 173 may include a mixture of Ag and Mg.

When the second electrode 173 is a transflective electrode or a reflective electrode, the second electrode 173 may include at least one of Ag, Mg, Al, Pt, Pd, Au, Ni, Nd, Ir, Cr, Li, Ca, LiF/Ca, LiF/Al, Mo, Ti, and Cu. In some implementations, the second electrode 173 may further include a transparent conductive layer including, for example, indium tin oxide (ITO), indium zinc oxide (IZO), zinc oxide (ZnO), and indium-zinc-tin oxide (IZTO), in addition to the transflective electrode or the reflective electrode.

At least one of an electron transport layer (ETL) and an electron injection layer (EIL) may be disposed between the organic light emitting layer 172 and the second electrode 173.

When the OLED 170 is a top emission type, the first electrode 171 may be a reflective electrode and the second electrode 173 may be a transmissive electrode or a transflective electrode. When the OLED 170 is a bottom emission type, the first electrode 171 may be a transmissive electrode or a transflective electrode, and the second electrode 173 may be a reflective electrode.

According to an embodiment, the OLED 170 may be a top emission type, the first electrode 171 may be a reflective electrode, and the second electrode 173 may be a transflective electrode.

Hereinafter, the protection layer 130 will be described in more detail.

According to an embodiment, the protection layer 130 may include a trench pattern 710 formed outside the first electrode 171 and recessed portions 211, 212, 213, and 214 located below the first electrode 171 and overlapping the opening 195.

The trench pattern 710 may include a plurality of trenches 711 extending along a first direction.

When a polymer resin has fluidity in a thermosetting process of the polymer resin for forming the protection layer 130, the trench pattern 710 may serve to substantially prevent the polymer resin from flowing to the recessed portions 211, 212, 213, and 214, which could impair the pattern stability of the recessed portions 211, 212, 213, and 214. For example, when thermosetting of the polymer resin for forming the protection layer 130 proceeds, the polymer resin may have fluidity in the thermosetting process. If such a polymer resin having fluidity were to flow to the recessed portions 211, 212, 213, and 214, the recessed portions 211, 212, 213, and 214 could be buried, and a depth of the recessed portions 211, 212, 213, and 214 could decrease or the recessed portions 211, 212, 213, and 214 could disappear. If the recessed portions 211, 212, 213, and 214 were to be buried in such a manner, the effect of substantially preventing color shift and white angular dependency (WAD) by the recessed portions 211, 212, 213, and 214 might not be achieved.

In order to substantially prevent such burying or a reduction of the depth of the recessed portions 211, 212, 213, and 214, the trench pattern 710 may be formed outside of the first electrode 171. When the trench pattern 710 is formed outside of the first electrode 171, polymer resin that has obtained fluidity may flow to the trench pattern 710 in the thermosetting process. Thus, the polymer resin may be substantially prevented from flowing to the recessed portions 211, 212, 213, and 214. Accordingly, the pattern stability of the recessed portions 211, 212, 213, and 214 may be ensured and the effect of substantially preventing color shift and WAD may be achieved by the recessed portions 211, 212, 213, and 214.

Each of the plurality of trenches 711 may be spaced apart in a plan view from the first electrode 171. Accordingly, the trench 711 may be disposed apart in a plan view from the edge 191 of the opening 195 located inside the first electrode 171.

A distance TL between the first electrode 171 and the trench 711 may depend on a size of the OLED 170, a size of the first electrode 171, a distance between adjacent ones of the first electrodes 171, or the like. For example, the trench 711 may be spaced apart from the first electrode 171 by a distance of about 1 µm to about 5 µm. For example, the trench 711 may be spaced apart from the first electrode 171 by a distance of about 1.5 µm to about 2.5 µm.

The trench 711 may have a predetermined width TW. The width TW of the trench 711 may vary depending on the size of the OLED 170, the size of the first electrode 171, the distance between adjacent ones of the first electrodes 171, or the like.

The trench 711 may have a concave cross-section. The trench 711 may have a predetermined depth d3, which may vary depending on a thickness of the protection layer 130. As examples, the trench 711 may have a depth d3 of about 0.2 µm to about 1.0 µm or a depth d3 of about 0.3 µm to about 0.7 µm. For example, when the protection layer 130 has a thickness of about 1 µm or more, the trench 711 may have a thickness of about 1 µm or more. For example, when the protection layer 130 has a thickness of about 0.3 µm or less, the trench 711 may have a thickness of about 0.3 µm or less.

Adjacent ones of the trenches 711 may be arranged at a predetermined pitch TP. The pitch TP between the plurality of trenches 711 may vary depending on a planar area of the first electrode 171 and a size of the OLED 170.

The protection layer 130 may include recessed portions 211, 212, 213, and 214 located at an area overlapping the opening 195, which is defined by the pixel defining layer 190. The first electrode 171 is also located above the recessed portions 211, 212, 213, and 214. Accordingly, the first electrode 171 may include corresponding recessed portions.

The recessed portions 211, 212, 213, and 214 may be spaced apart in a plan view from the edge 191 of the opening 195. For example, an edge BR of the recessed portions 211, 212, 213, and 214 may spaced apart in a plan view from the edge 191 of the opening 195.

The term "edge 191 of the opening 195" may refer to a boundary of the opening 195, and may be defined as a boundary at which the pixel defining layer 190 contacts the first electrode 171. The edge 191 of the opening 195 may be defined as a boundary at which the protection layer 130 and the pixel defining layer 190 overlap each other in a plan view.

Referring to FIGS. 1 and 2, the recessed portions 211, 212, 213, and 214 may be absent below the edge 191 of the opening 195. For example, the recessed portions 211, 212, 213, and 214 may not overlap the edge 191 of the opening 195.

The protection layer 130 may have a substantially same height h1 with respect to a surface of the substrate 111 at a boundary where the protection layer 130 overlaps the pixel defining layer 190. For example, the protection layer 130 may have a substantially same height h1 along the edge 191 of the opening 195.

For example, the protection layer 130 may have a height difference of about 0.1 µm or less with respect to the surface of the substrate 111 at the boundary where the protection layer 130 overlaps the pixel defining layer 190.

According to an exemplary embodiment, the edge 191 of the opening 195 may also have a substantially same height with respect to the surface of the substrate 111. For example, the edge 191 of the opening 195 may have a height difference of about 0.1 µm or less with respect to the surface of the substrate 111.

The pixel defining layer 190 may be formed through a patterning process such as a photolithography method. For example, the edge 191 of the opening 195 may correspond to a boundary of a pattern. In this regard, if a lower surface of the pattern boundary were to be non-uniform, that is, not flat, it could difficult to form a uniform pattern. Accordingly, the edge 191 of the opening 195 may have a uniform height to be flat, and occurrence of pattern defects in the process of forming the pixel defining layer 190 may be substantially prevented.

The recessed portions 211, 212, 213, and 214 may be spaced apart from the edge 191 of the opening 195 such that the edge 191 of the opening 195 may be flat.

According to this embodiment, the recessed portions 211, 212, 213, and 214 may be spaced apart in a plan view from the edge 191 of the opening 195 by a distance of about 0.5 µm to about 5.0 µm. Accordingly, a distance V1 between the recessed portions 211, 212, 213, and 214 and the edge 191 of the opening 195 may be determined by a distance between the edge 191 of the opening 195 and the edge BR of the recessed portions 211, 212, 213, and 214.

The distance V1 between the recessed portions 211, 212, 213, and 214 and the edge 191 of the opening 195 may vary depending on the size of the OLED 170. For example, the recessed portions 211, 212, 213, and 214 may be spaced apart in a plan view from the edge 191 of the opening 195 by a distance in a range from about 0.5 µm to about 2.0 µm, or may be spaced apart in a plan view from the edge 191 of the opening 195 by a distance of about 5.0 µm or more.

At least a part of the edge BR of the recessed portions 211, 212, 213, and 214 may be parallel to the edge 191 of the opening 195. Referring to FIG. 1, at least one side of the edge BR of the recessed portions 211, 212, 213, and 214 may be parallel to the edge 191 of the opening 195.

When the edge BR of the recessed portions 211, 212, 213, and 214 and the edge 191 of the opening 195 are parallel to each other, the distance V1 between the recessed portions 211, 212, 213, and 214 and the edge 191 of the opening 195 may be easily maintained. Accordingly, the pattern may be formed uniformly in the process of forming the pixel defining layer 190.

The width W1 of the recessed portions 211, 212, 213, and 214 may vary depending on the size of the OLED 170, the size of the first electrode 171, the number of the recessed portions, or the like. According to an embodiment, the recessed portions 211, 212, 213, and 214 may have a width W1 in a range from about 1.0 µm to about 2.0 µm.

A depth d1 of the recessed portions 211, 212, 213, and 214 may vary depending on the thickness of the protection layer 130. In some implementations, the recessed portions 211, 212, 213, and 214 may have a depth d1 of about 0.2 µm to about 1.0 µm. For example, the recessed portions 211, 212, 213, and 214 may have a depth d1 of about 0.3 µm to about 0.7 µm. When the protection layer 130 has a thickness of about 1 µm or more, the recessed portions 211, 212, 213, and 214 may have a thickness of about 1 µm or more. When the protection layer 130 has a thickness of about 0.3 µm or less, the recessed portions 211, 212, 213, and 214 may have a thickness of about 0.3 µm or less.

When the recessed portions 211, 212, 213, and 214 have such a width W1 and depth d1, light generated in the organic light emitting layer 172 may resonate in a lateral direction. Accordingly, color shift and WAD depending on the viewing angle may be substantially prevented or mitigated.

Adjacent ones of the recessed portions 211, 212, 213, and 214 may be arranged at a pitch P1 of about 1 µm to about 6 µm. The pitch between the recessed portions 211, 212, 213, and 214 may vary depending on the planar area of the first electrode 171 and the size of the OLED 170.

The first electrode 171 may contact the driving thin film transistor TFT2 through the third contact hole CH3 defined at the protection layer 130. Referring to FIGS. 1 and 2, the recessed portions 211, 212, 213, and 214 may have a depth less than a depth d2 of the third contact hole CH3. In some implementations, the recessed portions 211, 212, 213, and 214 may have a depth substantially equal to the depth of the third contact hole CH3 or may have a depth greater than the depth of the third contact hole CH3.

Referring to FIG. 2, the protection layer 130 may include two or more recessed portions 211, 212, 213, and 214 overlapping one opening 195. The first electrode 171 may be disposed above the plurality of recessed portions 211, 212, 213, and 214. The first electrode 171 may overlap the plurality of recessed portions 211, 212, 213, and 214. Accordingly, the first electrode 171 may include a recessed portion corresponding to the recessed portions 211, 212, 213, and 214.

FIGS. 3, 4, 5, 6, and 7 are respective plan views illustrating arrangements of a first electrode 171, a recessed portion 221 and a trench pattern of one pixel according to some embodiments.

In order to avoid redundancy, descriptions of components described above may be omitted.

In FIGS. 3, 4, 5, 6, and 7, "R" refers to a red pixel, "G" refers to a green pixel, and "B" refers to a blue pixel. An edge 191 of an opening 195 shown in FIGS. 3, 4, 5, 6, and 7 is located in an area of the first electrode 171.

The first electrode 171 may be formed in various planar shapes as desired. For example, the first electrode 171 as illustrated in FIGS. 3, 4, 5, 6, and 7 has an octagonal planar shape. As illustrated in FIGS. 3, 4, 5, 6, and 7, openings 195 of respective pixels R, G, and B may have shapes and planar areas that are different from each other according to the color of the respective pixels R, G, and B.

The protection layer 130 may include a plurality of recessed portions 221 having a dot shape. Each of the recessed portions 221 may have a circular planar shape. The plurality of recessed portions 221 may be arranged within a boundary defined by the edge 191 of the opening 195. The plurality of recessed portions 221 may be arranged symmetrically or asymmetrically with respect to a central portion of the opening 195. The planar areas of the plurality of recessed portions 221 may vary according to the color of the pixels R, G, and B where the respective recessed portions 221 are located. A total planar area of the plurality of recessed portions 221 may be proportional to a planar area of the opening 195 in which the corresponding recessed portions 221 are located. For example, as illustrated in FIGS. 3, 4, 5, 6, and 7, when the blue pixel B has a greatest planar area and the green pixel G has a smallest planar area, the recessed portion 221 at the opening 195 of the blue pixel B may have a greatest total planar area, and the recessed portion at the opening 195 of the green pixel G may have a smallest total planar area.

The trench pattern 720 includes a plurality of trenches 721, 722, 723, 724, and 725 extending along a first direction.

According to the embodiments illustrated in FIGS. 3, 4, 5, 6, and 7, the plurality of trenches 721, 722, 723, 724, and 725 may be disposed apart planarly from the first electrode 171. Accordingly, the trenches 721, 722, 723, 724, and 725, in a plan view, may be disposed apart from the edge 191 of the opening 195 that is disposed inside the first electrode 171.

A distance TL between the first electrode 171 and the trenches 721, 722, 723, 724, and 725 may vary depending on a size of an OLED 170, a size of the first electrode 171, a distance between adjacent ones of the first electrodes 171, or the like. The trenches 721, 722, 723, 724, and 725 may be spaced from the first electrode 171 by a distance of about 1 µm to about 5 µm. For example, the trenches 721, 722, 723, 724, and 725 may be spaced apart from the first electrode 171 by a distance of about 1.5 µm to about 2.5 µm.

The trenches 721, 722, 723, 724, and 725 have a predetermined width TW. The width TW of the trenches 721, 722, 723, 724, and 725 may vary depending on the size of the OLED 170, the size of the first electrode 171, the distance between adjacent ones of the first electrodes 171, or the like.

Adjacent ones of the trenches 721, 722, 723, 724, and 725 may be arranged at a predetermined pitch TP. The pitch TP between the trenches 721, 722, 723, 724, and 725 may vary depending on a planar area of the first electrode 171 and the size of the OLED 170.

According to as the embodiment illustrated in FIG. 3, the trenches 721 may extend with a straight line shape along the first direction. The first direction may be a direction parallel to one of a gate line and a data line. In some implementations, the first direction may be a direction that forms a predetermined angle with respect to one of the gate line and the data line. For example, according to the embodiment illustrated in FIG. 4, the plurality of trenches 722 may extend with a straight line shape along a direction at a predetermined angle with respect to one of the gate line or the data line.

Figure 4:
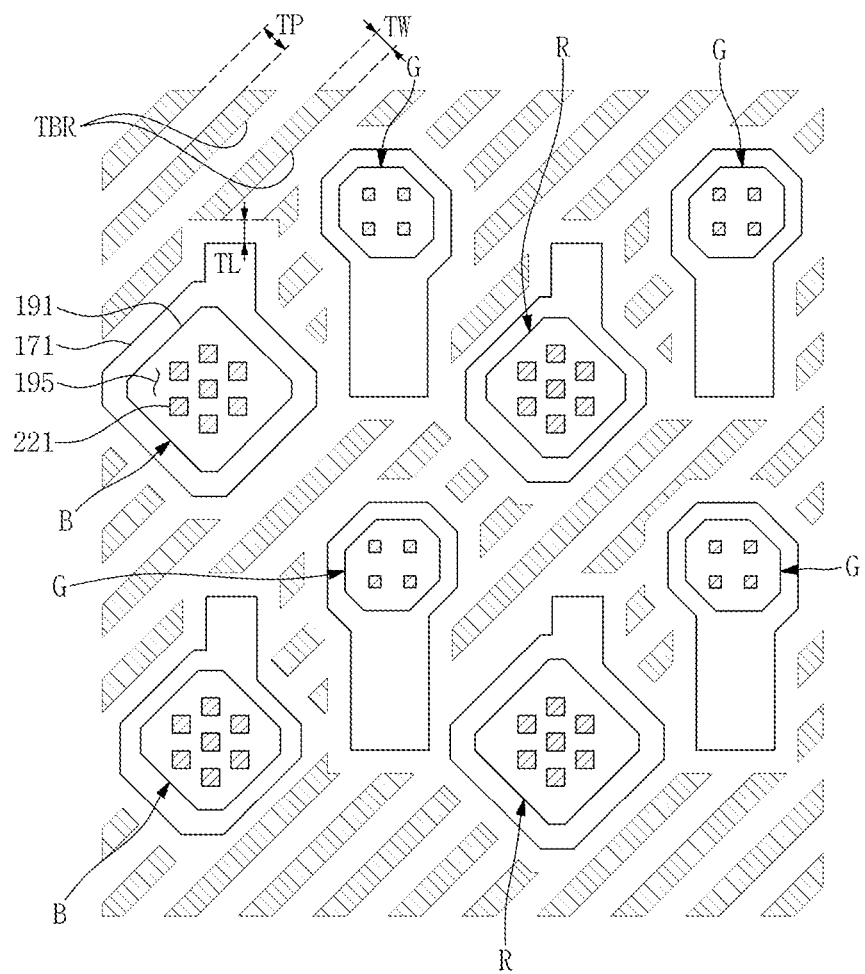
FIG. 4 illustrates a plan view of an arrangement of a first electrode, a recessed portion and a trench pattern of a pixel according to an embodiment.

In the embodiment illustrated in FIG. 4, at least a part of an edge TBR of the trenches 721 and 722 may be parallel to an edge of the first electrode 171. At least one side of the edge TBR of the trenches 721 and 722 may be parallel to the edge of the first electrode 171. For example, as illustrated in FIG. 3, at least one side of the edge TBR of the trenches 721 and 722 may be parallel to an edge of the first electrode 171 of the green pixel G. In addition, as illustrated in FIG. 4, at least one side of the edge TBR of the trenches 721 and 722 may be parallel to an edge of the first electrode 171 of the red and blue pixels R and B. In some implementations, and the edge TBR of the trenches 721 and 722 may not be parallel to any edge of the first electrode 171.

When the edge TBR of the trenches 721 and 722 and the edge of the first electrode 171 are parallel to each other, it may be easy to maintain the distance TL between the first electrode 171 and the trenches 721 and 722, such that a pattern may be uniformly formed in the process of forming the pixel defining layer 190.

Figure 5:
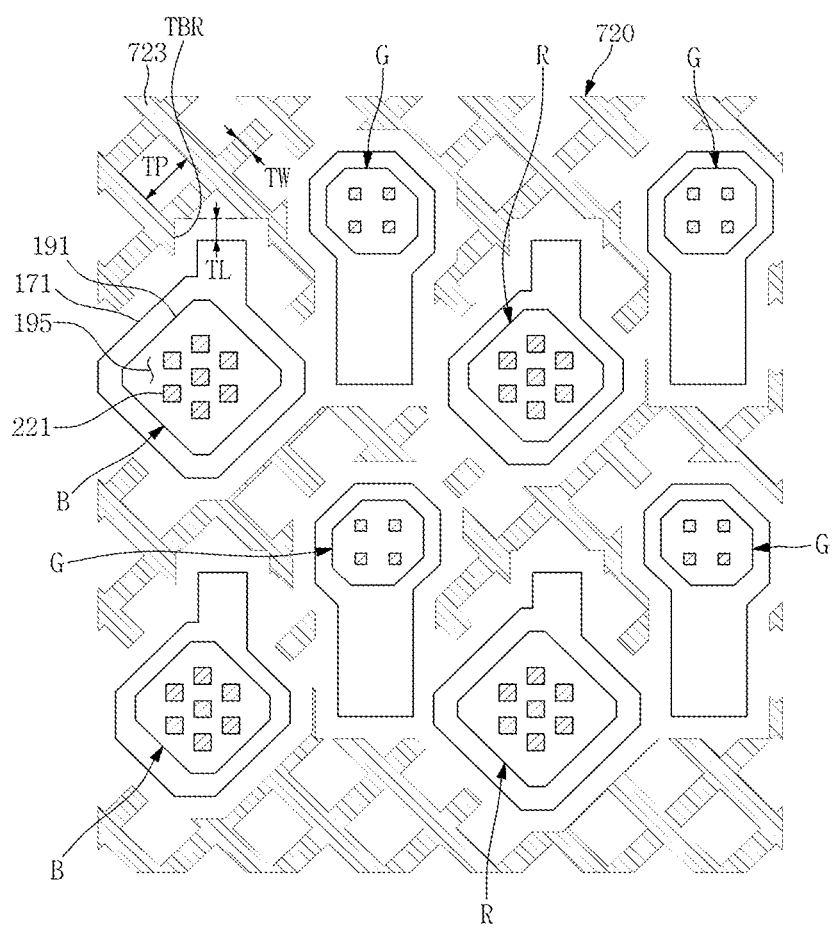
FIG. 5 illustrates a plan view of an arrangement of a first electrode, a recessed portion and a trench pattern of a pixel according to an embodiment.

According to the embodiment illustrated in FIG. 5, a plurality of trenches 723 may include a stem trench extending in a straight line shape along the first direction and a branch trench branching from the stem trench in a second direction that crosses the first direction. The first direction may be a direction forming a predetermined angle with respect to one of the gate line and the data line, and the second direction may be a direction perpendicular to the first direction. For example, the trench pattern 720 may be in the form of a broken mesh.

At least a part of an edge TBR of the trench 723 may be parallel to the edge of the first electrode 171. At least one side of the edge TBR of the trench 723 may be parallel to the edge of the first electrode 171. For example, at least one side of the edge TBR of the trench 723 may be parallel to an edge of the first electrode 171 of the green pixel G. In addition, at least one side of the edge TBR of the trench 723 may be parallel to an edge of the first electrode 171 of the red and blue pixels R and B. In some implementations, the edge TBR of the trench 723 may not be parallel to any edge of the first electrode 171.

When the edge TBR of the trench 723 and the edge 191 of the opening 195 are parallel to each other, it may be easy to maintain a distance TL between the first electrode 171 and the trench 723, such that a pattern may be uniformly formed in the process of forming the pixel defining layer 190.

Figure 6:
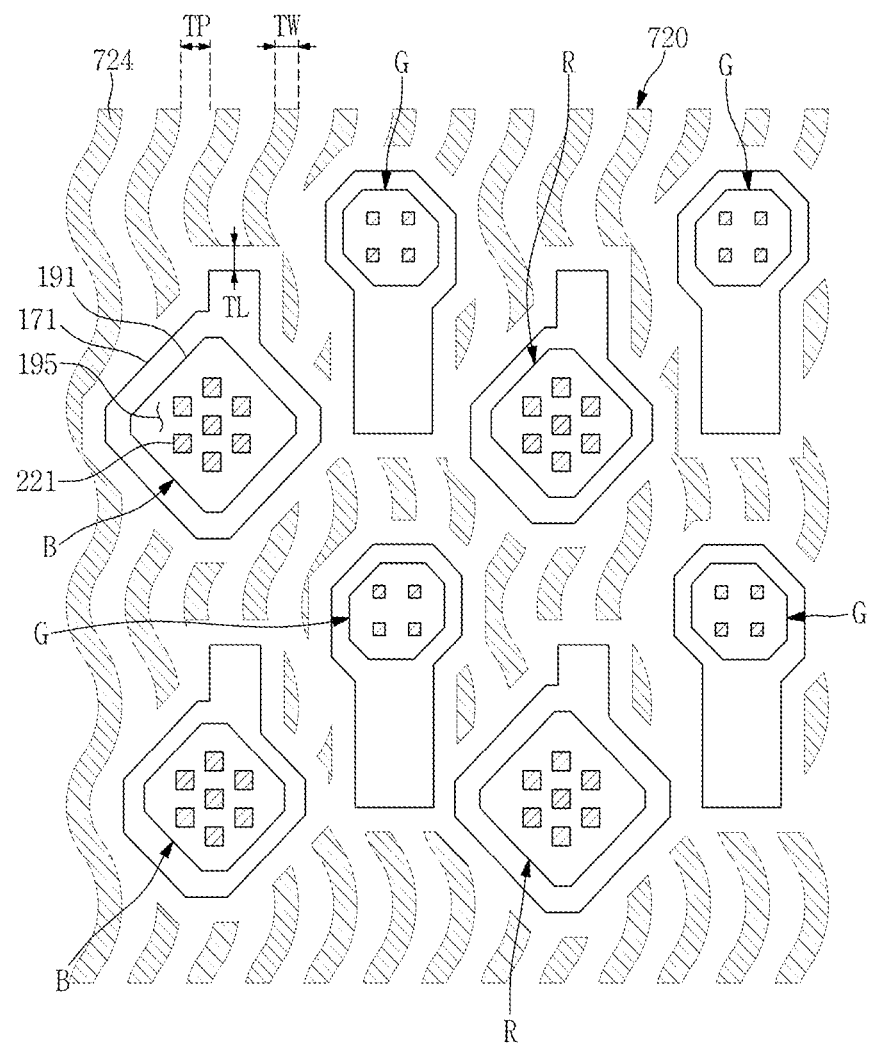
FIG. 6 illustrates a plan view of an arrangement of a first electrode, a recessed portion and a trench pattern of a pixel according to an embodiment.

According to as the embodiment illustrated in FIG. 6, the trench 724 may extend substantially in a wavy shape along the first direction.

In such an exemplary embodiment, the first direction may be a direction parallel to one of the gate line and the data line. In some implementations, the first direction may be a direction that forms a predetermined angle with respect to one of the gate line and the data line.

Figure 7:
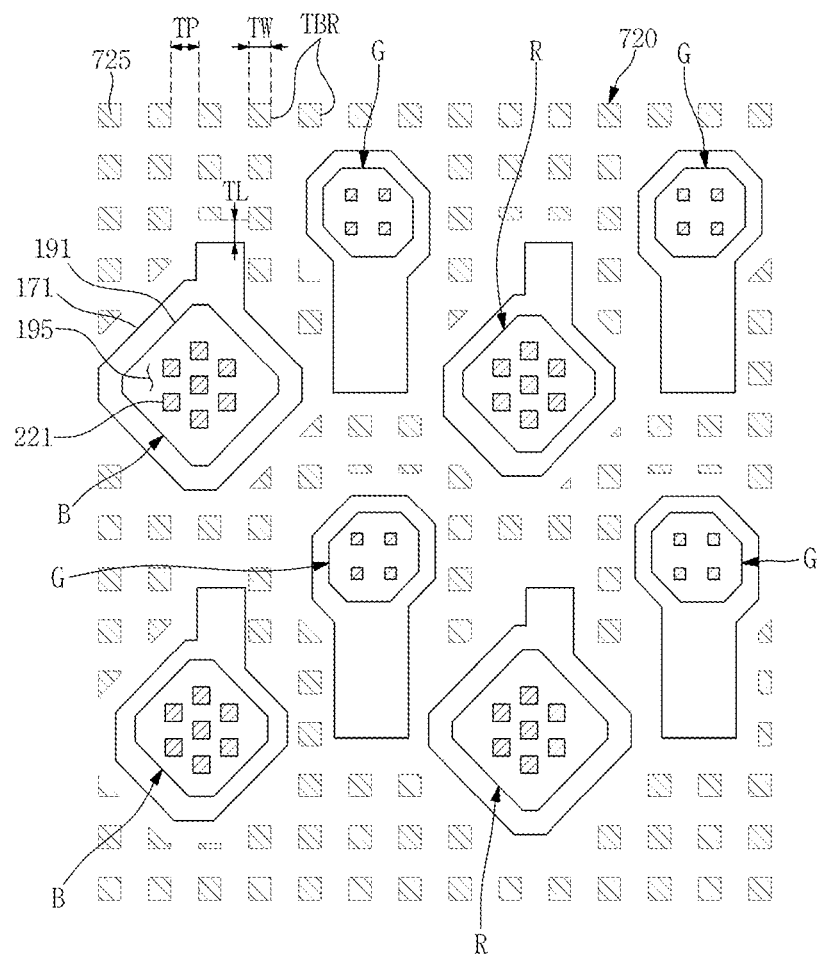
FIG. 7 illustrates a plan view of an arrangement of a first electrode, a recessed portion and a trench pattern of a pixel according to an embodiment.

According to as the embodiment illustrated in FIG. 7, the trench 725 may have a dot shape. For example, the trench 725 may have one of a circular shape and a polygonal shape. For example, the trench 725 may have a circular shape.

Figure 8:
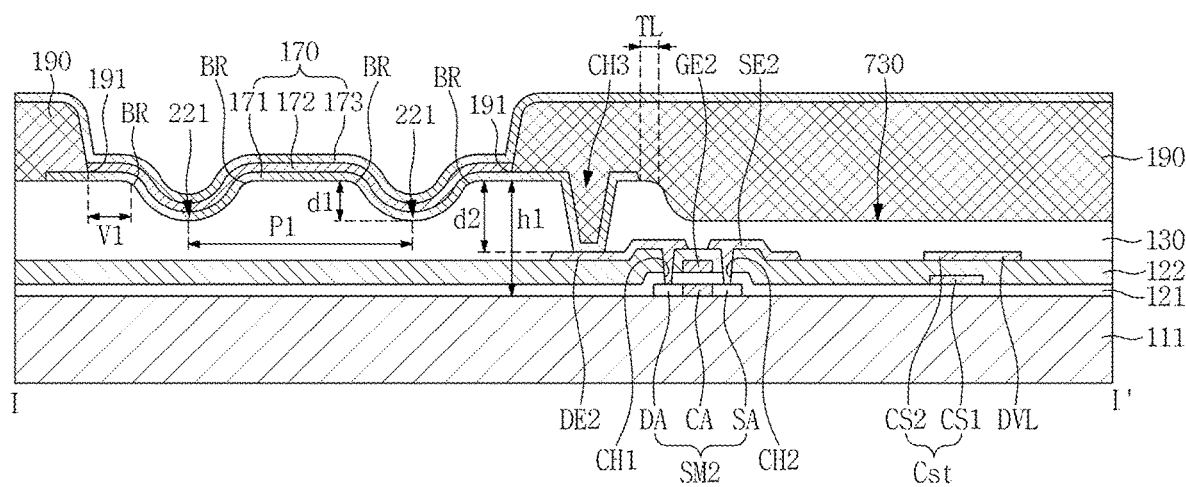
FIG. 8 illustrates a cross-sectional view according to an embodiment.
Figure 9:
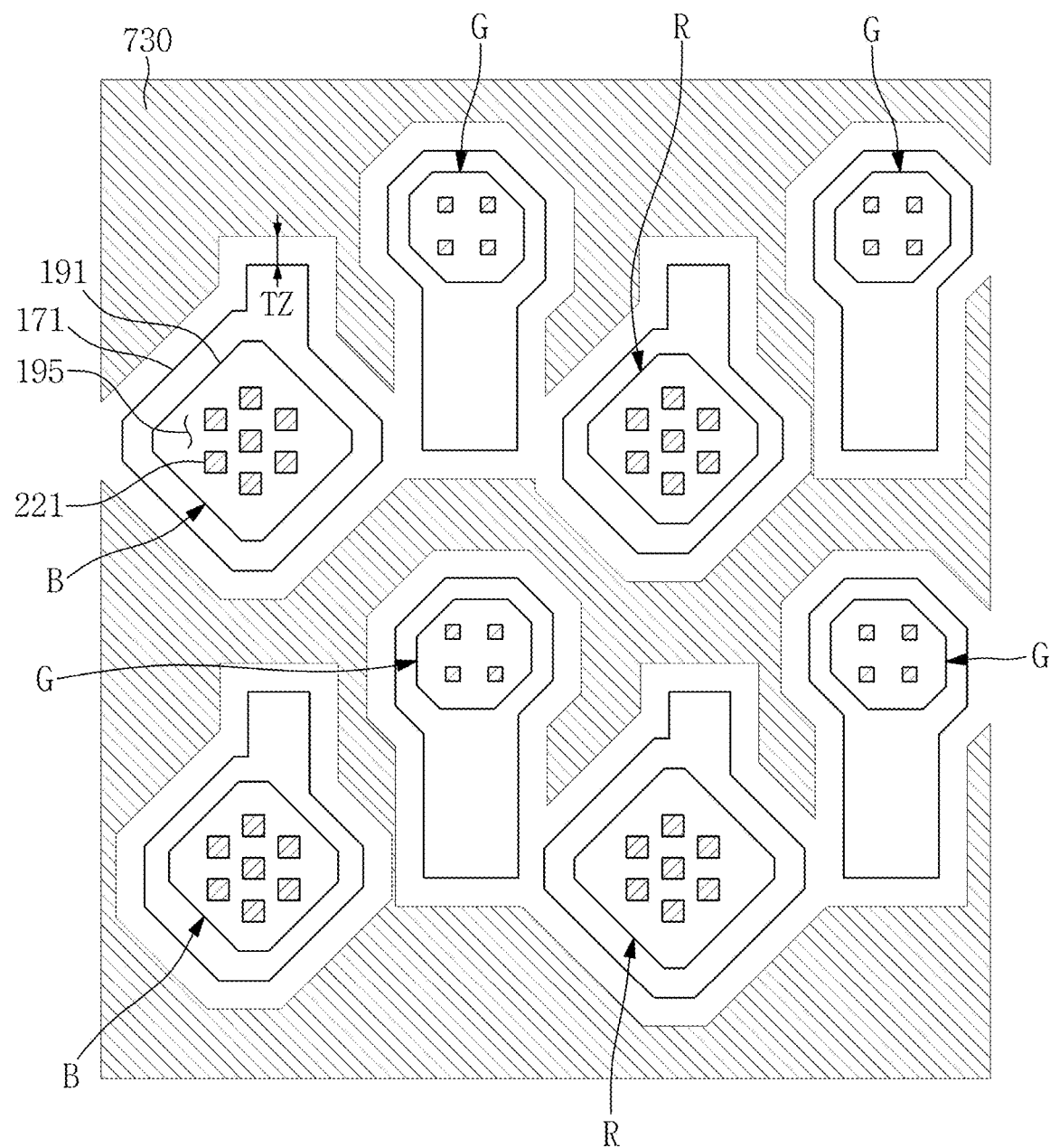
FIG. 9 illustrates a plan view of an arrangement of a first electrode, a recessed portion and a trench pattern of a pixel according to the embodiment illustrated in FIG. 8.

FIG. 8 illustrates a cross-sectional view according to an FIG. 9 illustrates a plan view of an arrangement of a first electrode, a recessed portion and a trench pattern of a pixel according to the embodiment.

Hereinafter, in order to avoid redundancy, descriptions of components described above will not be repeated.

According to the embodiment illustrated in FIGS. 8 and 9, a protection layer 130 may include a trench pattern 730 formed outside a first electrode 171 and a recessed portion 221 located below the first electrode 171 and overlapping an opening 195.

The trench pattern 730 may have a concave cross-section and may be disposed apart from the first electrode 171 in a plan view. A distance TL between the trench pattern 730 and the first electrode 171 may vary depending on a size of an OLED 170, a size of the first electrode 171, a distance between adjacent ones of the first electrodes 171, or the like. For example, the trench pattern 730 may be spaced apart from the first electrode 171 by a distance in a range from about 1 μm to about 5 μm. For example, the trench pattern may be spaced apart from the first electrode 171 by a distance in a range from about 1.5 μm to about 2.5 μm.

According to the embodiment illustrated in FIGS. 8 and 9, the trench pattern 730 may surround the first electrode 171 on a plane and may have a unitary structure.

The trench pattern 730 may have a shape substantially identical to a shape of the pixel defining layer 190 in a plan view. In some implementations, the trench pattern 730 may have a planar area less than a planar area of the pixel defining layer 190 in a plan view. For example, the trench pattern 730 may not overlap the opening 195 and may be disposed apart from an edge 191 of the opening 195.

The trench pattern 730 may have a height less than a height of the protection layer 130, at a boundary where the protection layer 130 overlaps the pixel defining layer 190, with respect to a surface of the substrate 111. For example, the trench pattern 730 may have a height less than a height of the edge 191 of the opening 195.

FIGS. 10A, 10B, 10C, and 10D are plan views illustrating arrangements of a first electrode 171, recessed portions 231, 241, 242, 243, 244, 251, 252, 253, and 254 and a trench pattern 740 of a pixel according to embodiments. Hereinafter, in order to avoid redundancy, descriptions of components described above will not be repeated.

Referring to FIGS. 10A, 10B, 10C, and 10D, the trench pattern 740 may include a plurality of trenches 741, 742, 743, and 744. The plurality of trenches 741, 742, 743, and 744 may extend along a first direction and may be disposed apart from each other. For example, the plurality of trenches 741, 742, 743, and 744 may be arranged in parallel to each other.

Adjacent ones of the trenches 741, 742, 743, and 744 may be arranged at a predetermined pitch TP. The pitch TP of the plurality of trenches 741, 742, 743, and 744 may vary depending on a planar area of the first electrode 171 and a size of an OLED 170.

The trenches 741, 742, 743, and 744 may have a predetermined width TW. The width TW of the trenches 741, 742, 743, and 744 may vary depending on the size of the OLED 170, the size of the first electrode 171, a distance between adjacent ones of the first electrodes 171, or the like.

Figure 10A:
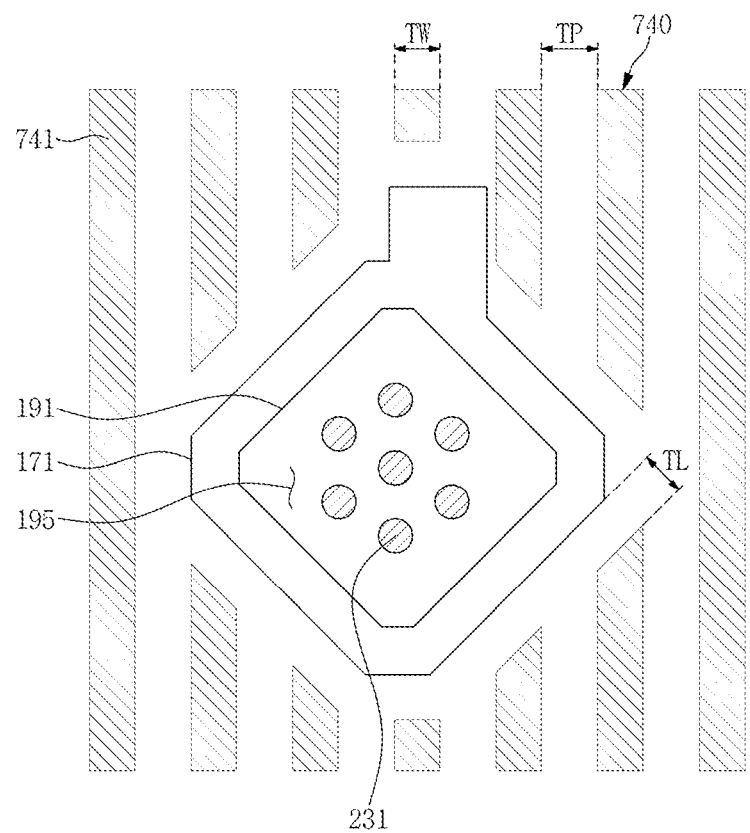
FIGS. 10A, 10B, 10C, and 10D illustrate plan views of arrangements of a first electrode, a recessed portion and a trench pattern of a pixel according to various embodiments.

Referring to FIG. 10A, the plurality of recessed portions 231 may have a circular planar shape. In some implementations, the recessed portion 231 may have other shapes such as a polygonal, elliptical or linear planar shape.

Figure 10B:
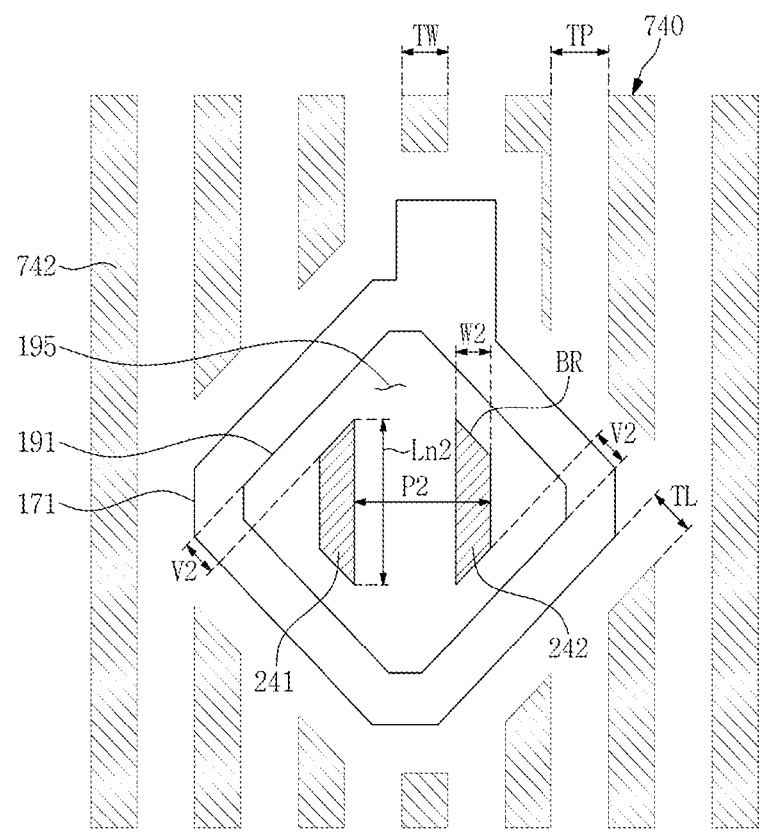

Referring to FIG. 10B, one first electrode 171 may be disposed above two recessed portions 241 and 242 each having a linear shape. For example, a protection layer 130 may include two recessed portions 241 and 242 defined at one opening 195. Referring to FIG. 10B, the two recessed portions 241 and 242 may each have a linear shape extending in a vertical direction with respect to the drawings. For example, the two recessed portions 241 and 242 extend parallel to each other in a substantially same direction and may have a symmetrical or substantially identical shape.

Each of the recessed portions 241 and 242 may be spaced from an edge 191 of the opening 195 by a predetermined distance V2. Each of the recessed portions 241 and 242 may have a width W2 and a length Ln2. The two recessed portions 241 and 242 may be arranged at a predetermined pitch P2.

Figure 10C:
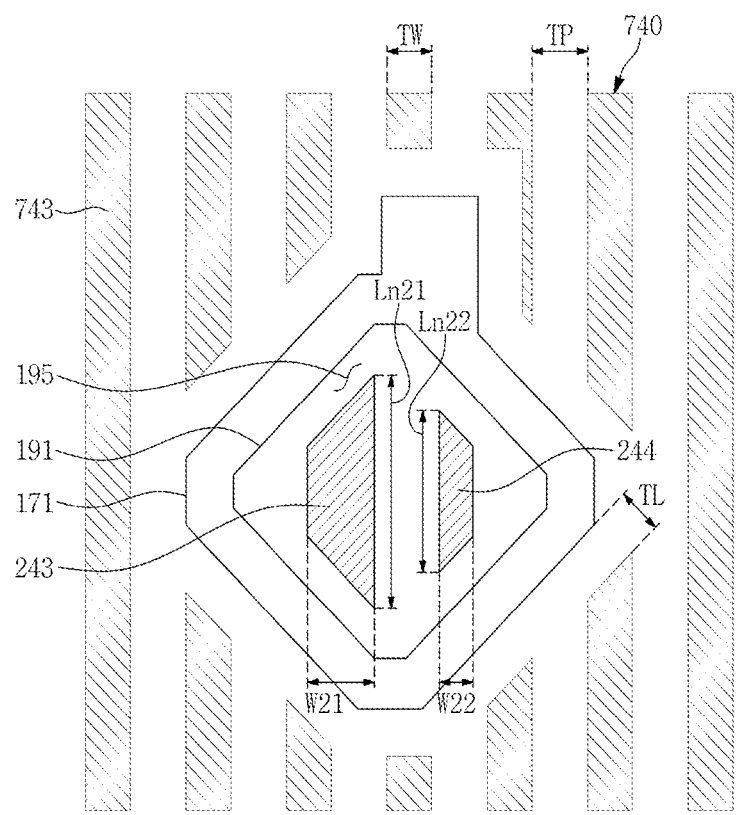

Referring to FIG. 10C, a plurality of recessed portions 243 and 244 that are asymmetric may be located below one first electrode 171. For example, the protection layer 130 includes a first recessed portion 243 and a second recessed portion 244 overlapping one opening 195. A planar area of the first recessed portion 243 may be greater than a planar area of the second recessed portion 244. In order to substantially prevent the first electrode 171 from contacting a wiring located below the first electrode 171 at the second recessed portion 244, a planar area of the second recessed portion 244 may be small such that a depth of the second recessed portion 244 is less than a depth of the first recessed portion 243.

For example, a length Ln21 of the first recessed portion 243 may be greater than a length Ln22 of the second recessed portion 244, and a width W21 of the first recessed portion 243 may be greater than a width W22 of the second recessed portion 244.

Figure 10D:
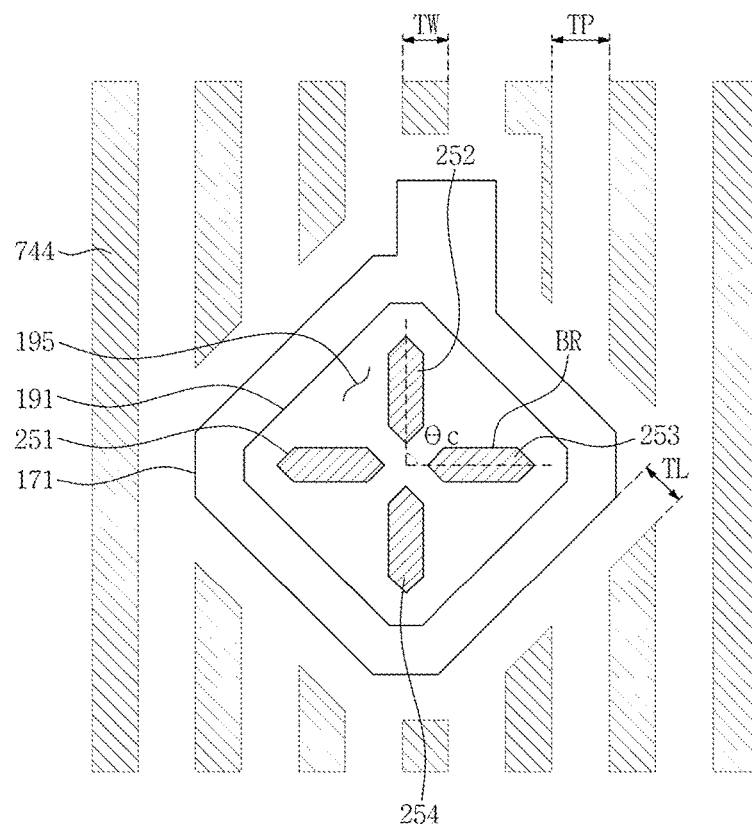

Referring to FIG. 10D, the protection layer 130 may include a plurality of recessed portions 251, 252, 253, and 254, each having a linear shape. The plurality of linear-shaped recessed portions 251, 252, 253, and 254 may overlap one opening 195 and may be arranged radially.

For example, four linear-shaped recessed portions 251, 252, 253, and 254 overlapping one opening 195 may be defined in the protection layer 130. In such an exemplary embodiment, an angle $\theta_C$ between extending directions of the recessed portions 251, 252, 253, and 254 may be in a range from about 60 degrees to about 120 degrees. For example, the four recessed portions 251, 252, 253, and 254 may be arranged such that the angle $\theta_C$ between the extending directions is about 90 degrees. As such, the recessed portions 251, 252, 253, and 254 may be arranged symmetrically with respect to a central portion of the opening 195.

In an exemplary embodiment, when the recessed portions 241 and 242 are arranged to extend in one direction as illustrated in FIGS. 10B and 10C, color shift and WAD in a direction perpendicular to the extending direction of the recessed portions 241 and 242 may be improved, whereas the degree of improvement in color shift and WAD in a direction substantially equal to the extending direction of the recessed portions 241 and 242 may be insignificant. For example, when the recessed portions 241 and 242 are arranged as illustrated in FIGS. 10B and 10C, WAD and color shift in a horizontal direction with respect to the drawings may be improved while the improvement in WAD and color shift in a vertical direction may be insignificant.

On the other hand, when the recessed portions 251, 252, 253, and 254 are arranged radially as illustrated in FIG. 10D, color shift and WAD may be improved in both the horizontal direction and the vertical direction with respect to the drawings.

Figure 11:
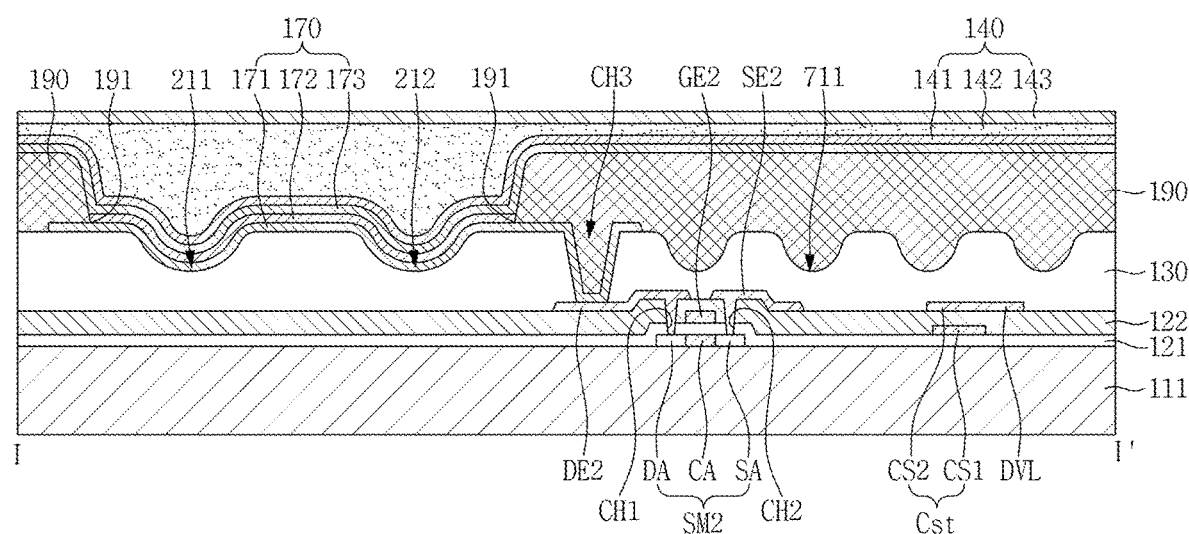
FIG. 11 illustrates a cross-sectional view of an OLED display device according to an eighth exemplary embodiment.

FIG. 11 illustrates a cross-sectional view illustrating an OLED display device according to an embodiment.

The OLED display device illustrated in FIG. 11 includes a thin film encapsulation layer 140 disposed on a second electrode 173 to protect an OLED 170. The thin film encapsulation layer 140 may serve to substantially prevent moisture or oxygen from permeating into the OLED 170.

The thin film encapsulation layer 140 may include at least one inorganic layer 141 and 143 and at least one organic layer 142 that are alternately disposed. The thin film encapsulation layer 140 illustrated in FIG. 11 may include two inorganic layers 141 and 143 and one organic layer 142.

The inorganic layers 141 and 143 may include at least one of a metal oxide, a metal oxynitride, a silicon oxide, a silicon nitride and a silicon oxynitride. The inorganic layers 141 and 143 may be formed using various suitable methods. For example, the inorganic layers 141 and 143 may be formed through methods such as a chemical vapor deposition (CVD) or an atomic layer deposition (ALD).

The organic layer 142 may include, for example, a polymer-based material. The organic layer 142 may be formed by a suitable method. For example, the organic layer 142 may be formed through a thermal deposition process. The thermal deposition process for forming the organic layer 142 may be performed within a temperature range that does not damage the OLED 170.

The inorganic layers 141 and 143, which have a high density of a thin film, may substantially prevent or efficiently reduce permeation of undesirable substances such as moisture or oxygen. Permeation of moisture and oxygen into the OLED 170 may be largely prevented by the inorganic layers 141 and 143.

Moisture and oxygen that have passed through the inorganic layers 141 and 143 may further be blocked by the organic layer 142. The organic layer 142 may also serve as a buffer layer to reduce stress between each of the inorganic layers 141 and 143, in addition to the moisture permeation preventing function. Further, the organic layer 142 may have planarizing characteristics. Accordingly, an uppermost surface of the thin film encapsulation layer 140 may be planarized by the organic layer 142.

The thin film encapsulation layer 140 may have a small thickness. Accordingly, an OLED display device having a significantly small thickness may be provided. Such an OLED display device may have excellent flexibility.

Figure 12:
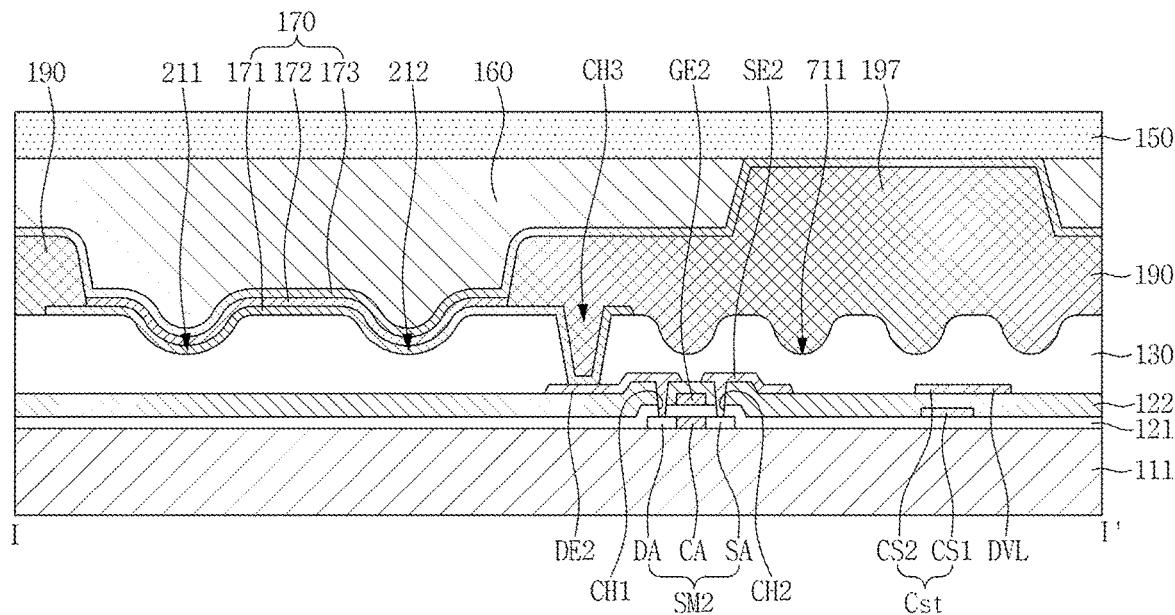
FIG. 12 illustrates a cross-sectional view illustrating an OLED display device according to an embodiment.

FIG. 12 illustrates a cross-sectional view of an OLED display device according to an embodiment.

The OLED display device illustrated in FIG. 12 includes a sealing member 150 disposed on a second electrode 173 to protect an OLED 170.

The sealing member 150 may include a light transmissive insulating material such as glass, quartz, ceramic and plastic. The sealing member 150 may have a plate shape and may be attached to a substrate 111 to protect the OLED 170.

A filler 160 may be disposed between the OLED 170 and the sealing member 150. The filler 160 may include an organic material, for example, a polymer. A protection layer including a metal or an inorganic material may be disposed on the OLED 170 to protect the OLED 170.

Referring to FIG. 12, the OLED display device may include a spacer 197 on a pixel defining layer 190. The spacer 197 may serve to maintain a distance between the substrate 111 and the sealing member 150. The spacer 197 may protrude toward an upper portion of the pixel defining layer 190, for example, a portion that is opposite to a protection layer 130.

Similar to the pixel defining layer 190, the spacer 197 may include a polyacrylic resin or a polyimide (PI) resin.

The spacer 197 and the pixel defining layer 190 may have a unitary structure. For example, the pixel defining layer 190 and the spacer 197 may be unitarily formed through a photolithography process using a photosensitive material. In some implementations, the pixel defining layer 190 and the spacer 197 may be formed sequentially or separately, or may include different materials, respectively.

The spacer 197 may have one of a truncated pyramid shape, a prism shape, a truncated cone shape, a cylinder shape, a hemisphere shape, or a hem i-spheroid shape.

Hereinafter, stages of a method of manufacturing the OLED display device 101 according to FIGS. 1 to 3 will be described with reference to FIGS. 13A, 13B, 13C, 13D, 13E, 13F, 13G, 13H, 13I and 13J. FIGS. 13A, 13B, 13C, 13D, 13E, 13F, 13G, 13H, 13I and 13J illustrate views of stages of a process of manufacturing the OLED display device 101 of FIGS. 1 to 3.

Figure 13A:
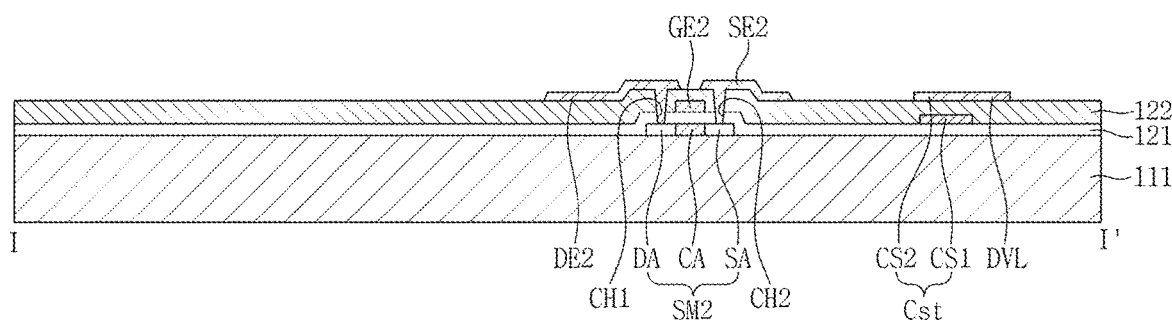
FIGS. 13A, 13B, 13C, 13D, 13E, 13F, 13G, 13H, 13I, and 13J illustrate views of a process of manufacturing the OLED display according to the embodiment illustrated in FIG. 1.

Referring to FIG. 13A, a driving thin film transistor TFT2 and a capacitor Cst may be formed on a substrate 111. Wirings such as a switching thin film transistor TFT1, a gate line GL, a data line DL and a driving voltage line DVL may be formed on the substrate 111 as well.

Figure 13B:
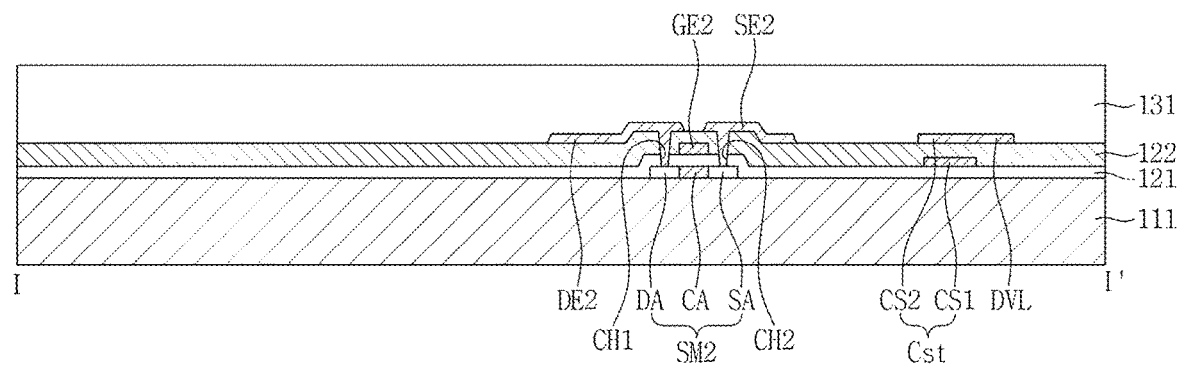

Referring to FIG. 13B, a photosensitive material may be applied over an entire surface of the substrate 111 including the driving thin film transistor TFT2 such that a photosensitive material layer 131 is formed. Examples of the photosensitive material may include a photodegradable polymer resin. Examples of the photodegradable polymer resin may include a polyimide (PI) resin.

Figure 13C:
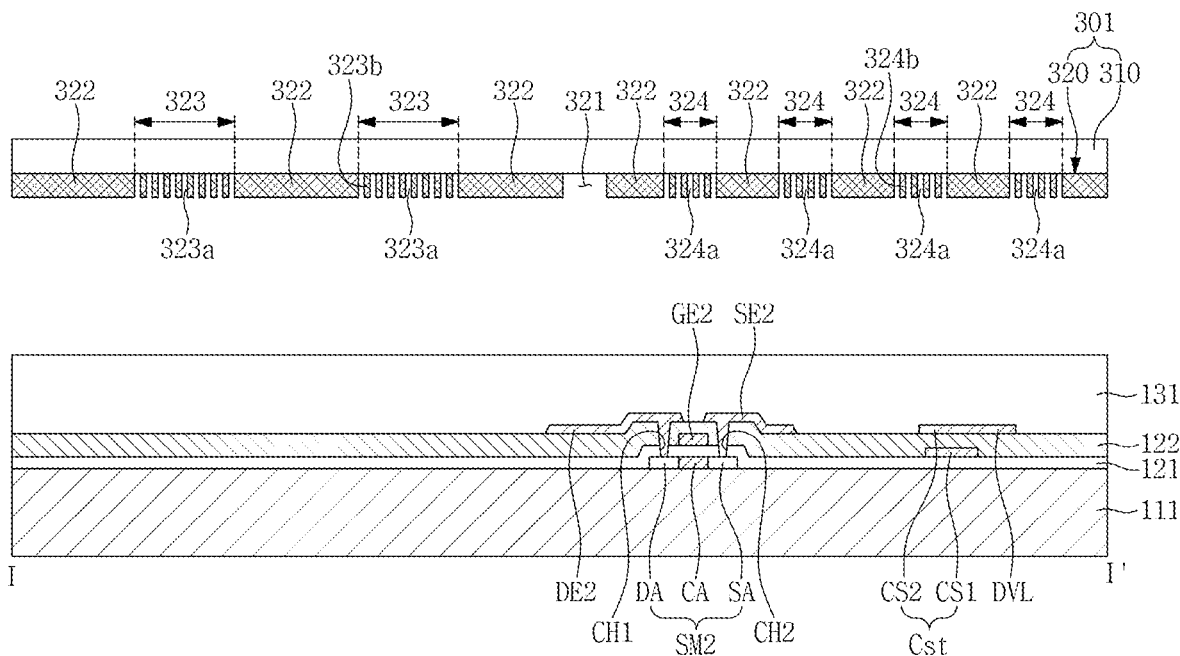

Referring to FIG. 13C, a first pattern mask 301 may be disposed above the photosensitive material layer 131, spaced apart from the photosensitive material layer 131.

The first pattern mask 301 may include a mask substrate 310 and a light blocking pattern 320 on the mask substrate 310. The light blocking pattern 320 may include at least three areas, each having different light transmittances. Such a first pattern mask 301 is also referred to as a "half tone mask."

The mask substrate 310 may include suitable material having light transmittance and mechanical strength. For example, the mask substrate 310 may be a transparent glass or plastic substrate.

The light blocking pattern 320 may be formed by selectively applying a light blocking material to the mask substrate 310. The blocking pattern 320 may include a light transmissive portion 321, a light blocking portion 322 and transflective portions 323 and 324.

The light transmissive portion 321 is a portion through which light is transmitted. The light transmissive portion 321 may be located above an area to be defined with a third contact hole CH3.

The light blocking portion 322 may be a portion at which light transmission is blocked. The light blocking portion 322 may be formed by applying a light blocking material to the mask substrate 310.

The transflective portions 323 and 324 are portions through which an incident light is partially transmitted. The transflective portions 323 and 324 may be located above an area to be defined with recessed portions 210 and 220 and an area to be formed with a trench pattern 710. For example, the transflective portions 323 and 324 may have a structure in which light transmissive areas 323a and 324a and light blocking slits 323b and 324b are alternately disposed. The light transmittance of the transflective portions 323 and 324 may be adjusted by adjusting a pitch between the light transmissive areas 323a and 324a and the light blocking slits 323b and 324b, respectively.

A transflective portion 323 located above the area to be defined with the recessed portions 211 and 212 and a transflective portion 324 located above the area to be formed with the trench pattern 710 may have a substantially equal light transmittance or may have different light transmittances. Depths of the recessed portions 211 and 212 and a depth of the trench pattern 710 may be respectively adjusted by adjusting the light transmittance.

In addition, in order to define the recessed portions 211 and 212 having a small planar area, the transflective portion 323 may include only one light transmissive area 323a. The planar area and depth of the recessed portions 211 and 212 may be adjusted by adjusting a planar area of the light transmissive area 323a.

The light transmittance of the transflective portions 323 and 324 may be adjusted by adjusting a concentration of the light blocking material.

Figure 13D:
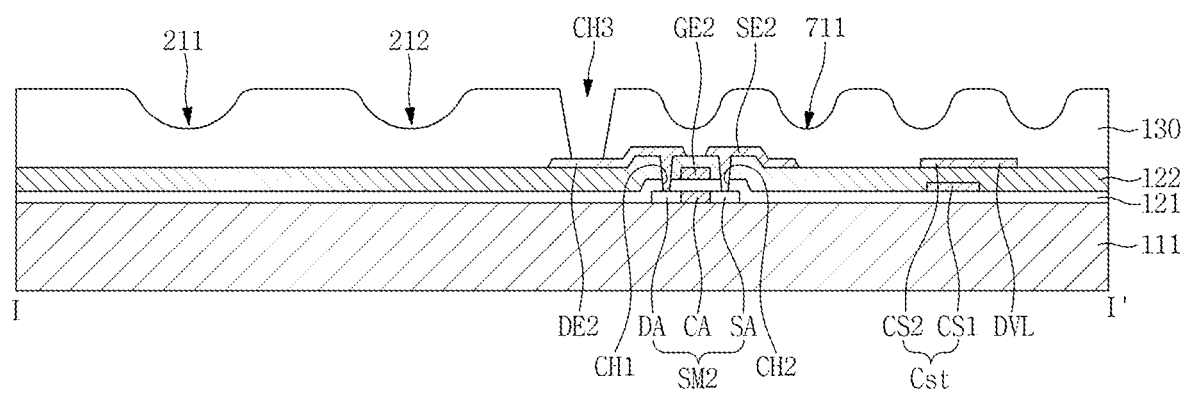

The photosensitive material layer 131 may be patterned through exposure using the first pattern mask 301 illustrated in FIG. 13C, such that a protection layer 130 including the recessed portions 210 and 220 and the trench pattern 710 is formed (see FIG. 13D).

For example, the photosensitive material layer 131 may be exposed and then developed, such that a pattern such as the recessed portions 210 and 220, the trench pattern 710 and the third contact hole CH3 is formed. Referring to FIG. 13D, after the exposure and development, the photosensitive material layer 131 may be thermally cured to form the protection layer 130. Polymeric resins forming the photosensitive material layer 131 may partially flow in the thermosetting process, thus forming gently curved recessed portions 210 and 220.

When the polymer resin forming the photosensitive material layer 131 has fluidity during the thermosetting process of the photosensitive material layer 131, if the polymer resin were to flow to the recessed portions 211 and 212, the recessed portions 211 and 212 could be be filled with the polymer resin to be buried. If the recessed portions 211 and 212 were to be filled, the depths of the recessed portions 211 and 212 could become shallow or the recessed portions 211 and 212 could disappear. If the depths of the recessed portions 211 and 212 were to become shallow or the recessed portions 211 and 212 were to disappear, the effect of substantially preventing color shift and WAD by the recessed portions 211 and 212 could be reduced or might not be achieved.

However, according to embodiments, the recessed portions 211 and 212 may be substantially prevented from being filled due to the forming the trench pattern 710 including a plurality of trenches 711 around the first electrode 171. For example, the polymer resin having fluidity in the thermosetting process of the photosensitive material layer 131 may flow toward the trench pattern 710 to substantially prevent the recessed portions 211 and 212 from being filled. Accordingly, pattern stability of the recessed portions 211 and 212 may be ensured and the recessed portions 211 and 212 may have a predetermined depth and a predetermined width.

As such, the trench pattern 710 may serve to maintain the pattern stability of the recessed portions 211 and 212 in the thermosetting process for forming the protection layer 130.

Figure 13E:
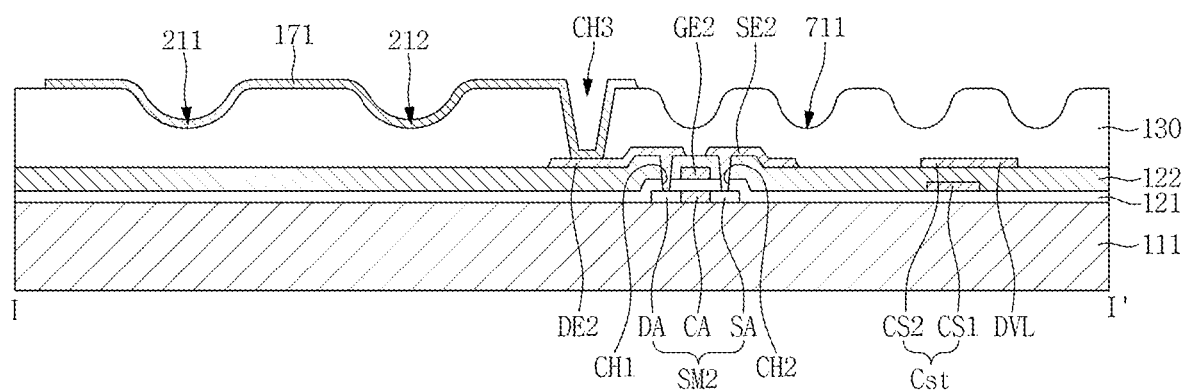

Referring to FIG. 13E, the first electrode 171 may be formed on the protection layer 130. The first electrode 171 may be electrically connected to a second drain electrode DE2 through the third contact hole CH3.

The first electrode 171 may also be disposed on the recessed portions 211 and 212. However, the first electrode 171 is not disposed on the trench pattern 710.

Figure 13F:
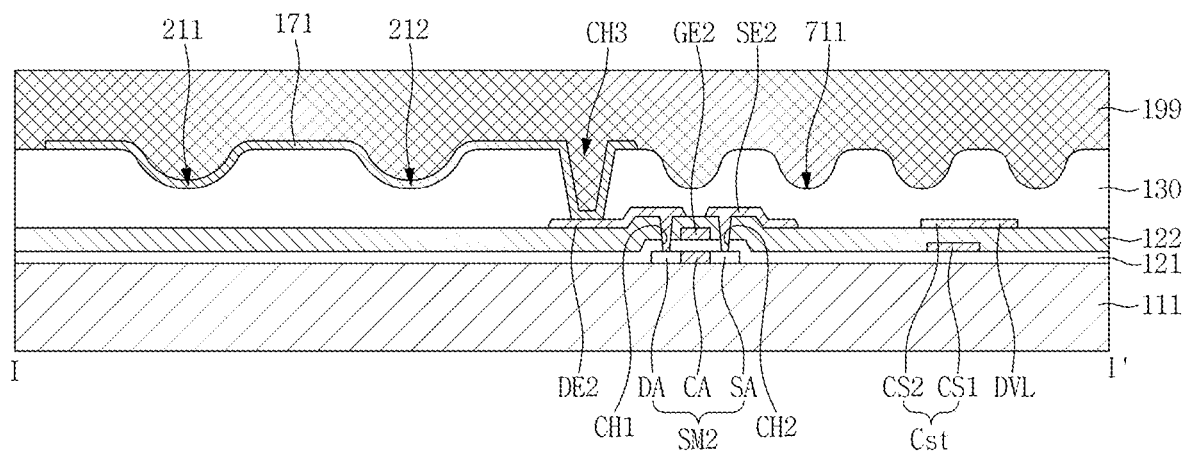

Referring to FIG. 13F, a photosensitive material layer 199 for forming a pixel defining layer may be disposed on the substrate 111 including the first electrode 171 and the protection layer 130.

The photosensitive material layer 199 for forming a pixel defining layer may include a photodegradable polymer resin. Examples of the photodegradable polymer resin may include a polyimide (PI)-based resin, a polyacrylic resin, a PET resin, and a PEN resin. For example, the photosensitive material layer 199 may include a polyimide (PI)-based resin.

Figure 13G:
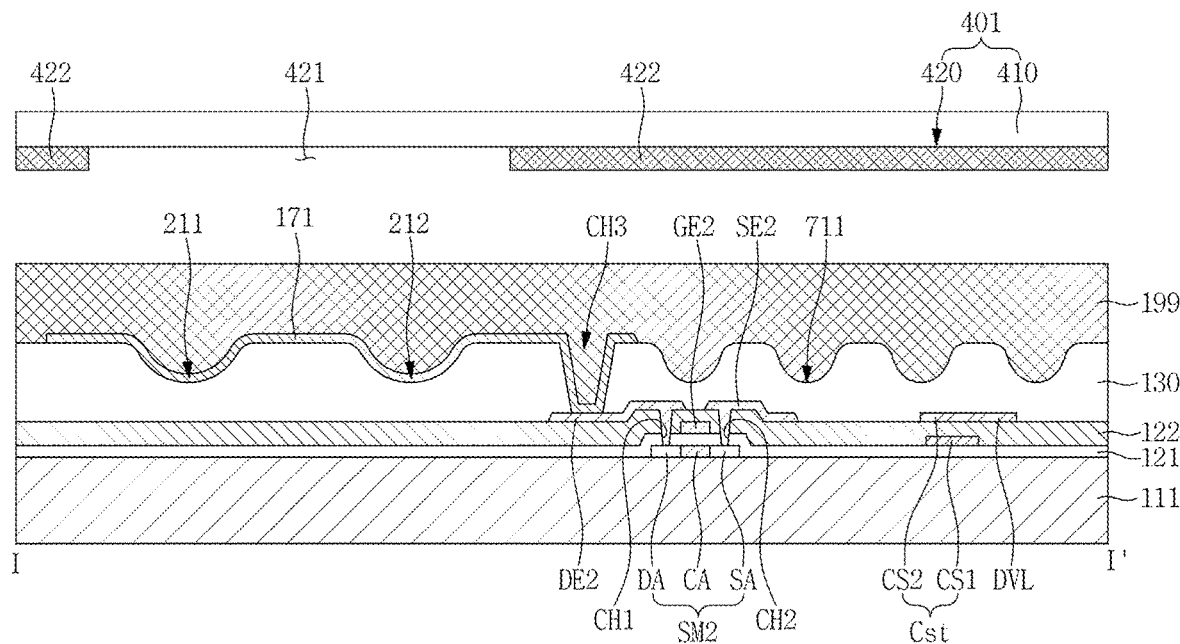

Referring to FIG. 13G, a second pattern mask 401 may be disposed above the photosensitive material layer 199.

The second pattern mask 401 may include a mask substrate 410 and a light blocking pattern 420 on the mask substrate 410. The mask substrate 410 may include a transparent glass or plastic substrate. The light blocking pattern 420 may include a light transmissive portion 421 and a light blocking portion 422.

The light transmissive portion 421 may be a portion through which light is transmitted. The light transmissive portion 421 may be located above an area to be defined with an opening 195. The light blocking portion 422 may be a portion where the transmission of light is blocked. The light blocking portion 422 may be located above an area other than the area to be defined with the opening 195.

The photosensitive material layer 199 may be patterned through a photolithography method using the second pattern mask 201, as illustrated in FIG. 13G. For example, the photosensitive material layer 199 may be exposed and then developed such that the opening 195 is defined.

Figure 13H:
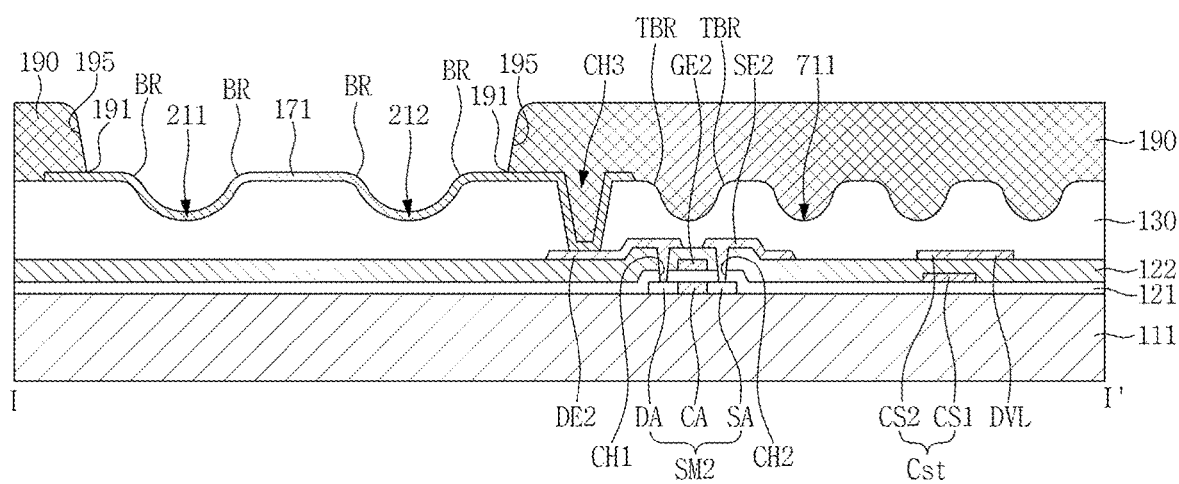

Referring to FIG. 13H, the patterned photosensitive material layer 199 may be thermally cured such that a pixel defining layer 190 is formed. Polymeric resins forming the photosensitive material layer 199 may partially flow during the thermosetting process.

The opening 195 and an edge 191 of the opening 195 may be defined by the pixel defining layer 190. The first electrode 171 may be exposed from the pixel defining layer 190 by the opening 195. The pixel defining layer 190 may expose an upper surface of the first electrode 171 and may protrude along a circumference of the first electrode 171. The pixel defining layer 190 may overlap an end portion of the first electrode 171, and the opening 195 may be located above the first electrode 171. The pixel defining layer 190 may be disposed above the trench pattern 710 such that an upper portion of the trench pattern 710 becomes flat.

In an implementation, the edge 191 of the opening 195 does not overlap the recessed portions 211 and 212. The edge 191 of the opening 195 may be spaced apart from the recessed portions 211 and 212. For example, an edge BR of the recessed portions 211 and 212 and the edge 191 of the opening 195 may be spaced apart from each other.

When a pattern is formed through a photolithography method, if a bottom surface of a boundary area of the pattern is not flat, it could be difficult to form a uniform pattern. According to embodiments, a recessed portion or an uneven portion are not formed at the edge 191 of the opening 195, and the edge 191 of the opening 195 is located on a flat surface. Accordingly, occurrence of pattern defects may be substantially reduced or prevented in the process of forming the pixel defining layer 190.

Figure 13I:
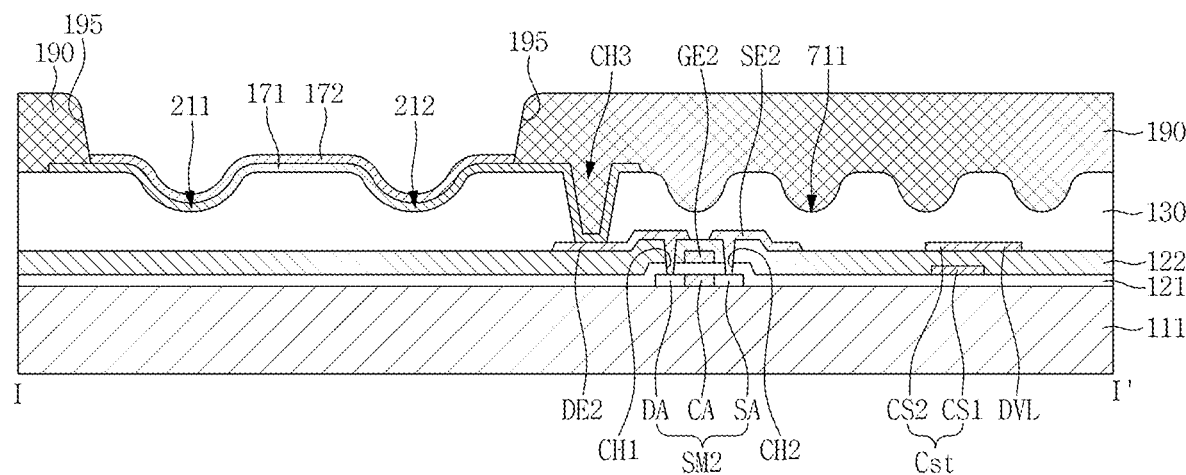

Referring to FIG. 13I, an organic light emitting layer 172 may be formed on the first electrode 171 that is exposed by the opening 195 of the pixel defining layer 190. The organic light emitting layer 172 may be formed by a deposition method.

Figure 13J:
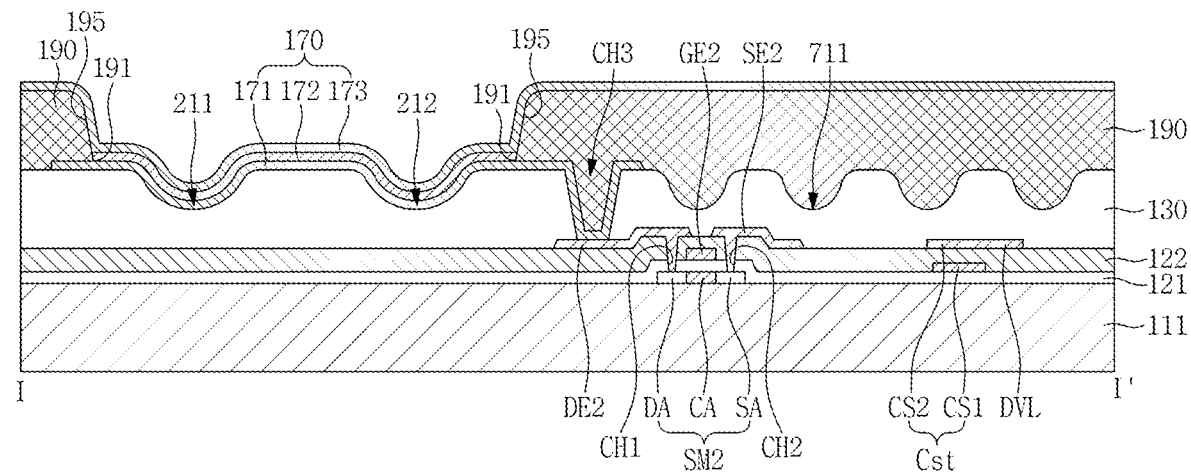

Referring to FIG. 13J, a second electrode 173 may be formed on the organic light emitting layer 172. The second electrode 173 may also formed on the pixel defining layer 190. The second electrode 173 may be formed by a deposition method.

Figure 14:
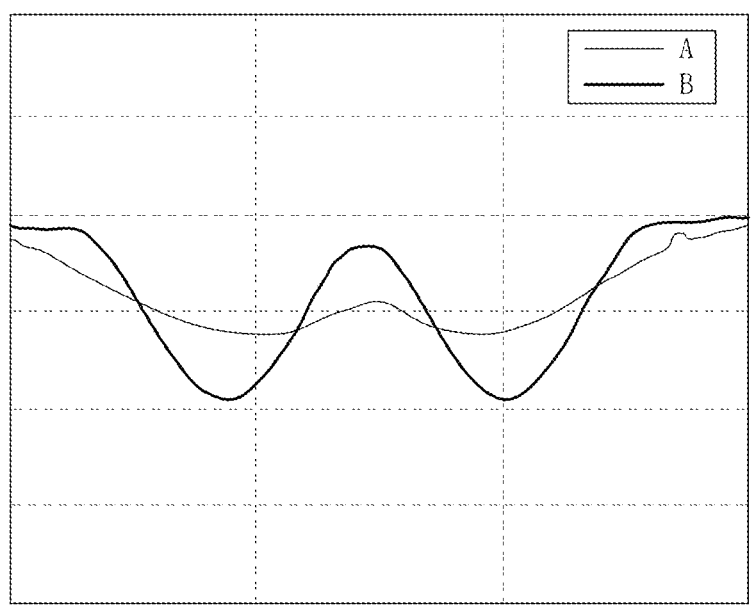
FIG. 14 illustrates a view of a relative height of a protection layer at an opening according to general art and an exemplary embodiment.

FIG. 14 illustrates a view showing a relative height of a protection layer at an opening according to a general art and an embodiment.

"A" represents a depth of a recessed portion of a protection layer at which a trench pattern is not formed according to a conventional art, and "B" represents a depth of a recessed portion of a protection layer at which a trench pattern is formed according to an exemplary embodiment.

Referring to FIG. 14, it may be appreciated that the depth of the recessed portion is deeper in "B" than the depth of the recessed portion in "A." For example, in the case of "A," when the polymer resin has fluidity, the polymer resin flows into the recessed portion, and the recessed portion is filled with the polymer resin to be buried. On the other hand, in the case of "B," the trench pattern is formed around the first electrode 171. It may be identified that the recessed portion is substantially prevented from being filled. For example, the polymer resin, which has fluidity in the thermosetting process of the photosensitive material layer 131, flows to the trench pattern, substantially preventing filling of the recessed portion. Accordingly, the pattern stability of the recessed portion is ensured, and the recessed portion may have a predetermined depth and width.

As set forth hereinabove, the OLED display devices according to one or more exemplary embodiments may include a recessed portion and a trench pattern formed at the protection layer. The recessed portion may serve to substantially prevent a color shift depending on the viewing angle, and the trench pattern may improve the pattern stability of the recessed portion. The OLED display devices that include such recessed portion and trench pattern may have excellent display characteristics.

By way of summation and review, general OLED display devices have a multi-layer structure that includes an OLED. However, such a structure may produce a color shift depending on the viewing angle when emitting a light which is generated in the OLED to the outside. This color shift may degrade display quality of the OLED display device. Accordingly, in order for the OLED display device to have excellent display quality, it is desirable to substantially prevent the occurrence of color shift in the OLED display device.

Embodiments provide an organic light emitting diode ("OLED") display device in which a color shift depending on a viewing angle is reduced to have improved display characteristics.

Embodiments provide an OLED display device having excellent pattern stability and provide a method of manufacturing the OLED display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope there as set forth in the following claims.

What is claimed is:
1. An organic light emitting diode display device, comprising:
a substrate;
a protection layer on the substrate, the protection layer including comprising a trench pattern and a recessed portion;
a first electrode on the protection layer;
a pixel defining layer on the protection layer, the pixel defining layer defining an opening, the opening exposing at least a part of the first electrode;
an organic light emitting layer on the first electrode; and
a second electrode on the organic light emitting layer,
wherein:
the recessed portion overlaps the opening and is spaced apart from an edge of the opening in a plan view of the display device,
the trench pattern includes comprises a plurality of trenches, each trench having a dot shape,
each trench of the plurality of trenches overlaps the pixel defining layer in the plan view, and each trench of the plurality of trenches is spaced apart from the first electrode in the plan view and has a concave cross-section.

2. The organic light emitting diode display device as claimed in claim 1, wherein the plurality of trenches have one of a circular shape or a polygonal shape.

3. The organic light emitting diode display device as claimed in claim 1, wherein the plurality of trenches are spaced apart from each other by a predetermined distance.

4. The organic light emitting diode display device as claimed in claim 1, wherein the plurality of trenches have a width of about 1.0 µm to about 3.0 µm.

5. An organic light emitting diode display device, comprising:
- a substrate;
- a protection layer on the substrate, the protection layer comprising a trench pattern and a recessed portion;
- a first electrode on the protection layer;
- a pixel defining layer on the protection layer, the pixel defining layer defining an opening, the opening exposing at least a part of the first electrode;
- an organic light emitting layer on the first electrode; and
- a second electrode on the organic light emitting layer, wherein:
- the recessed portion overlaps the opening and is spaced apart from an edge of the opening in a plan view of the display device, and
- the trench pattern has a concave cross-section, is spaced apart from the first electrode in the plan view, and is a single unit surrounding the first electrode in the plan view.

6. The organic light emitting diode display device as claimed in claim 5, wherein the trench pattern overlaps the pixel defining layer in the plan view.

7. The organic light emitting diode display device as claimed in claim 5, wherein a planar area of the trench pattern is less than a planar area of the pixel defining layer on a plane.

8. The organic light emitting diode display device as claimed in claim 5, wherein a height of the trench pattern is less than a height of the edge of the opening with respect to a surface of the substrate.

9. The organic light emitting diode display device as claimed in claim 5, wherein the trench pattern is spaced apart from the first electrode by a distance of about 1 µm to about 5 µm in the plan view.

10. The organic light emitting diode display device as claimed in claim 5, wherein the trench pattern has a depth of about 0.2 µm to about 1.0 µm.

11. An organic light emitting diode display device, comprising:
- a substrate;
- a protection layer on the substrate, the protection layer comprising a trench pattern and recessed portions;
- a first electrode layer on the protection layer, the first electrode layer comprising a plurality of first electrodes;
- a pixel defining layer on the protection layer, the pixel defining layer defining openings, each opening exposing at least a part of one of the first electrodes;
- an organic light emitting layer on the first electrode layer; and
- a second electrode layer on the organic light emitting layer, wherein:
- each of the recessed portions overlap a corresponding opening of the openings and is spaced apart from an edge of the corresponding opening in a plan view of the display device,
- the trench pattern comprises a plurality of trenches, each trench having a dot shape, and
- each trench of the plurality of trenches is spaced apart from the first electrode layer in the plan view and has a concave cross-section.

* * * * *